US005572591A

United States Patent [19]

Numazu et al.

[11] Patent Number: 5,572,591

[45] Date of Patent: Nov. 5, 1996

[54] SOUND FIELD CONTROLLER

[75] Inventors: Hiroko Numazu; Masaharu Matsumoto; Akihisa Kawamura; Ryou Tagami, all of Osaka; Mikio Oda, Yawata, all of Japan

[73] Assignee: Matsushita Electric Industrial Co., Ltd., Osaka, Japan

[21] Appl. No.: 207,960

[22] Filed: Mar. 8, 1994

[30] Foreign Application Priority Data

| | | | |
|---|---|---|---|
| Mar. 9, 1993 | [JP] | Japan | 5-047708 |
| Mar. 9, 1993 | [JP] | Japan | 5-047710 |
| Apr. 15, 1993 | [JP] | Japan | 5-088397 |
| May 25, 1993 | [JP] | Japan | 5-122519 |

[51] Int. Cl.[6] H04R 5/00; H03G 3/00

[52] U.S. Cl. 381/1; 381/17; 381/18; 381/63; 84/630

[58] Field of Search 381/1, 63, 61, 381/62, 17, 0.22, 27, 18, 28; 84/629, 630, D24

[56] References Cited

U.S. PATENT DOCUMENTS

| | | | |
|---|---|---|---|
| 4,748,669 | 5/1988 | Klayman . | |
| 4,856,064 | 8/1989 | Iwamatsu | 381/1 |
| 4,980,914 | 12/1990 | Kunugi et al. . | |
| 5,040,219 | 8/1991 | Ando et al. | 381/61 |
| 5,067,157 | 11/1991 | Ishida et al. | 381/1 |
| 5,241,604 | 8/1993 | Noguchi . | |
| 5,381,482 | 1/1995 | Matsumoto | 381/1 |

FOREIGN PATENT DOCUMENTS

| | | |
|---|---|---|
| 56-110400 | 9/1981 | Japan . |
| 4-73693 | 3/1992 | Japan . |

*Primary Examiner*—Curtis Kuntz
*Assistant Examiner*—Xu Mei
*Attorney, Agent, or Firm*—Ratner & Prestia

[57] ABSTRACT

According the present invention, a sound field controller for reproducing a sound field with presence comprising; input terminals for inputting an audio signal having a first and a second channel signals, a signal extracting circuit for receiving and processing the audio signal, and producing an extracted signal of the audio signal, an operation circuit for receiving the extracted signal from the signal extracting circuit, performing the convolution on the extracted signal, and generating a convolution sum signal, a delay circuit for delaying the convolution sum signal by a predetermined time, and producing a delayed signal, an adding circuit for receiving the audio signal and the delayed signal, and adding the audio signal and the delayed signal with a predetermined summation ratio to produce a summed signal, and output terminals for reproducing the summed signal to localize a sound image in a desirable direction.

6 Claims, 20 Drawing Sheets

FIG. 19A
FIG. 19B
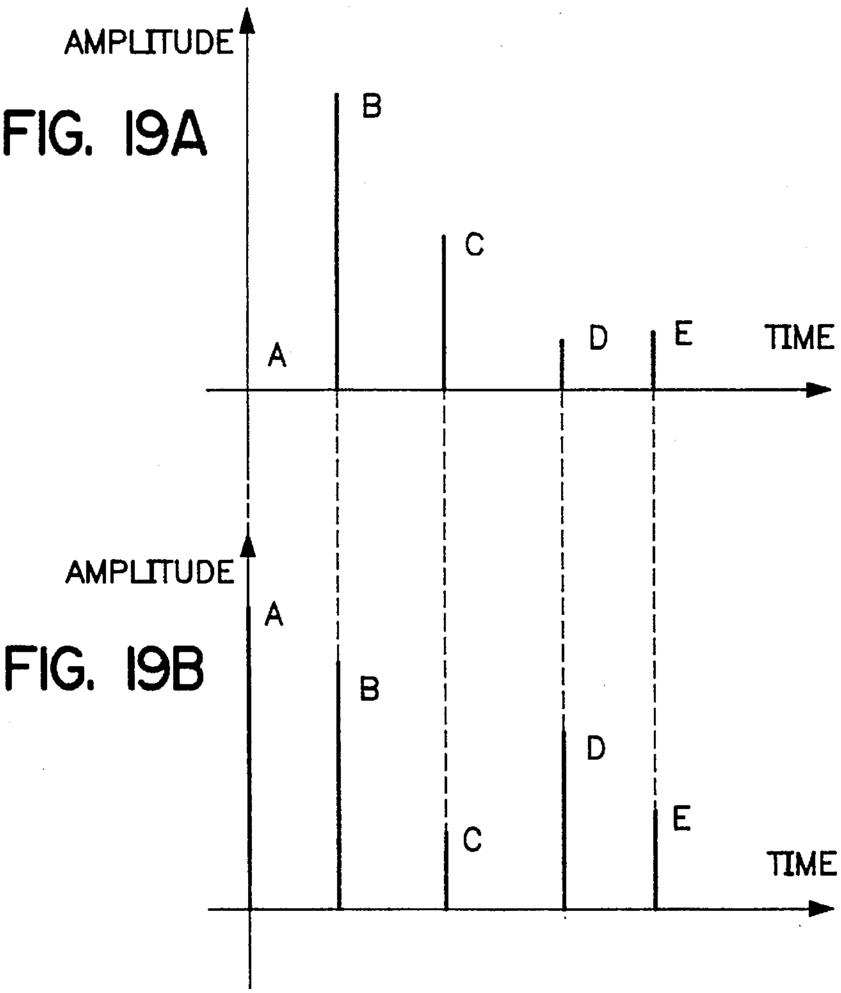
FIG. 19C
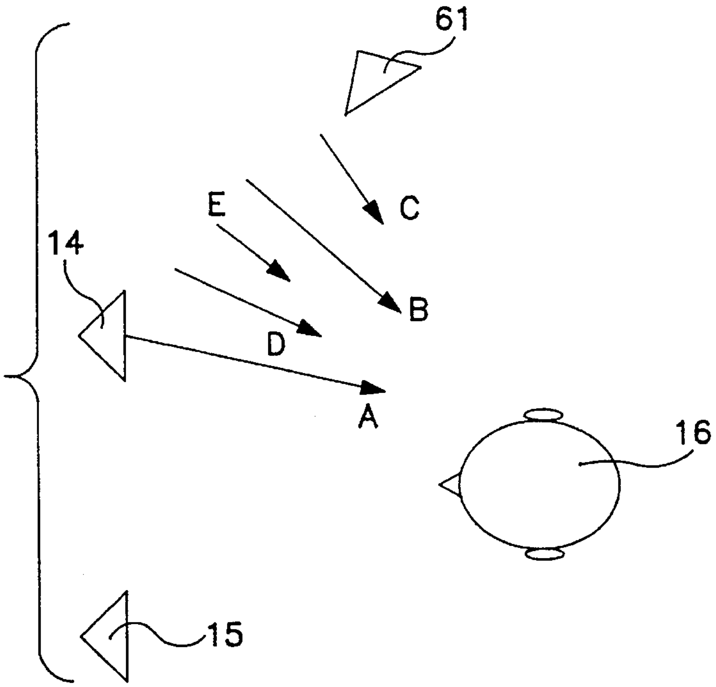

SOUND FIELD CONTROLLER

BACKGROUND OF THE INVENTION

1. Field of the Invention

The present invention relates to a sound field controller for reproducing sound effects for use in audio equipment or in audio-visual (AV) equipment.

2. Description of the Related Art

In recent years, as VTRs (video tape recorders) have become a common household item, a large-screened display and a sound reproduction system giving a sense of presence are desired to enjoy music recorded on recording media or programmed in softwares as well as movies on video tapes at home, thereby giving rise to the requirement of corresponding hardware development.

A conventional sound field controller will be explained with reference to the figures.

FIG. 20 shows a hardware block diagram indicating the structure of a conventional sound field controller. Stereo-audio signals are input via input terminals 1 and 2 to the sound field controller. The conventional sound field controller comprises a multiplier 62 for multiplying an input signal by −1, an adder 63 adds the input signals, a delay circuit 64 for delaying the input signal by a predetermined time, adders 12-5 and 13-5 for adding the input signals, a multiplier 65 for multiplying the input signal by −1, and speakers 14 and 15 for reproducing the signals and playing the sound for a listener 16 facing the speakers 14 and 15. ML(t) and MR(t) represent a Left-channel signal and a Right-channel signal of the stereo-audio signal respectively, and t represents a continuous time, ML(t) and MR(t) being functions of time. $\tau_3$ represents the delay time in the delay circuit 64.

The operation of the conventional sound field controller configured as above will be explained with reference to FIG. 20.

ML(t) is applied through the input terminal 1, and MR(t) through the input terminal 2. Each of the signals ML(t) and MR(t) thus input is divided into two parts, so that MR(t) is inputted to the adders 63 and 12-5 and ML(t) to the multiplier 62 and the adder 13-5. The multiplier 62 multiplies ML(t) by −1, and the result −ML(t) is applied to the adder 63. The adder 63 adds MR(t) and −ML(t) to produce the result MR(t)−ML(t), which is applied to the delay circuit 64. The delay circuit 64 delays MR(t)−ML(t) by fixed time and produces $MR(t-\tau_3)-ML(t-\tau_3)$. The output signal of the delay circuit 64 is divided into two branches of signal. One signal is applied to the adder 12-5, and the other signal to the multiplier 65. The multiplier 65 multiplies $MR(t-\tau_3)-ML(t-\tau_3)$ by −1, and the result of multiplication, $-(MR(t-\tau_3)-ML(t-\tau_3))$, is applied to the adder 13-5. The adder 12-5 adds MR(t) and $MR(t-\tau_3)-ML(t-\tau_3)$, and the sum $MR(t)+MR(t-\tau_3)-ML(t-\tau_3)$ is produced and output from the speaker 14. The adder 13-5 adds ML(t) and $-(MR(t-\tau_3)-ML(t-\tau_3))$, and the result $ML(t)-(MR(t-\tau_3)-ML(t-\tau_3))$, is output from the other speaker 15.

In this process, the signals $MR(t-\tau_3)-ML(t-\tau_3)$ and $-(MR(t-\tau_3)-ML(t-\tau_3))$ in antiphases each other are mixed with the respective input signals and reproduced from the two speakers respectively, with the result that a sound field is generated with an non-identifiable localization of the sound image (or, the subtracted signals cancel the crosstalks thereby to yield the feeling as if the right and left signals are reproduced from outside of the two speakers). By adjusting the mix balance with ML(t) and MR(t) which are unprocessed direct sound signals, a sound field is produced with expansion and presence (i.e. the sound is produced with giving a sense of expansion of the sound and a sense of presence to a listener). For example, a sound reproduction giving a listener the illusion of being in the same room (such as a concert-hall) as the original source of sound rather than in the room with the sound reproducing system is a sound reproduction with presence.

In the above-mentioned structure, however, adjustment of the sound field is performed by the mix balance between the antiphased sounds and direct sounds. Thus, if the antiphased sounds are relatively small, that would reduce the effect, while if the antiphased sounds are made larger to emphasize the effect, that would strengthen the antiphased sound, bringing about an uncomfortable feeling to the listener. Further, in the case where the input signal is a voice-sound signal, the conventional structure has a problem that the voice component is reduced when the difference signal of the input signal is added to the input signal, thereby the reproduced voice sound being ambiguous.

FIG. 21 shows a block diagram of a conventional sound field controller capable of sound reproduction with presence.

In FIG. 21, input terminals 1 and 2 are supplied with a signal ML(t) to be reproduced from the left side channel (Lch) as viewed from the listener 16 and a signal MR(t) to be reproduced from the right side channel (Rch) as viewed from the listener 16, respectively. These input terminals 1 and 2 are connected to speakers 74 and 75. These two signals are added to each other by an adder 72 at a predetermined ratio, and then applied to a speaker 76 arranged at the front center of the listener 16.

Also, the two signals ML(t) and MR(t) are processed and applied to a surround signal generation circuit 71. The surround signal generation circuit 71 generates a signal S(t) called a surround signal indicting a reverberation and/or a reflection, which is caused when the input signal is output from the speakers in an ordinary room. The surround signal S(t) produced by the surround signal generation circuit 71 is applied to two speakers 69 and 70 arranged on the left and right sides of the listener 16. The signals ML(t) and MR(t) normally represent what is called the stereo signal, or main signals as compared with the surround signal S(t).

In the structure shown in FIG. 21, the 2 -channel (2ch) signals ML(t) and MR(t) normally reproduced from the VTR, etc. are applied to the surround signal generation circuit 71. The surround signal generation circuit 71 generates the surround signal S(t) of the reverberation or the reflection. The main signals ML(t) and MR(t) are reproduced from the speakers 74 and 75 respectively, and the surround signal S(t) is divided into two parts and reproduced from the speakers 69 and 70. Also, the main signals ML(t) and MR(t) are added at a predetermined ratio by the adder 72, and the resulting sum signal is reproduced from the speaker 76.

As compared with a 2ch stereo reproduction system generally using two front speakers, the above-mentioned audio reproduction system allows a sound reproduction with good presence by reproducing sounds that had been audible from the front only or sounds that could not be heard, from the sides or behind as a surround sound. Further, since the main signals ML(t) and MR(t) are added at an appropriate level and reproduced from the center speaker 76, the front sound image is definitely localized.

In the above-mentioned structure, however, additional speakers arranged on the side or behind for reproducing surround signal are required as well as the space for accommodating the speakers.

In view of the problems of the conventional sound field controllers described above, the object of the present invention is to provide a sound field controller having a simple structure which is capable of unambiguous reproduction of a sound signal with presence and natural expansion.

Another object of the present invention is to provide a sound field controller for reproducing the sounds including the reflected and/or reverberation which are audible as if they are from positions other than the reproduction point of the speakers, thereby making possible a sound reproduction with presence without using any additional speakers on the sides or behind the listener.

SUMMARY OF THE INVENTION

A first sound field controller for reproducing a sound field with presence of this invention, comprises an input unit for inputting an input audio signal having a first and a second channel signals, a signal extracting circuit for receiving and processing the input audio signal, and producing an extracted signal of the input audio signals, an operation circuit for receiving the extracted signal from the signal extracting circuit, performing a convolution on the extracted signal, and generating a convolution sum signal, a delay circuit for delaying the convolution sum signal by a predetermined time, and producing a delayed signal, an adding circuit for receiving the input audio signal and the delayed signal, and adding the input audio signal and the delayed signal with a predetermined summation ratio to produce a summed signal, and an output circuit for reproducing the summed signal to localize a sound image in a desirable direction.

A second sound field controller for reproducing a sound field with presence according to the present invention, comprises; an input unit for inputting an input audio signal having two channel signals, a signal extracting circuit for receiving and processing the input audio signals, and producing an extracted signal of the input audio signals, a delay circuit for delaying the extracted signal by a predetermined time, and producing a delayed signal, a signal judging circuit for receiving the input audio signals and judging whether the input audio signals are voice signals or a non-voice audio signal and to output a detecting signal indicating the result, a correlation determining circuit for determining correlation ratio between the two channel signals of the input signal to output a determining signal, an adding circuit for receiving the input audio signals, the delayed signal, the detecting signal, and the determining signal, adding the input audio signals and the delayed signal with a predetermined summation ratio based on the detecting signal and the determining signal, and producing a resulting summed signal, and an output unit for reproducing the summed signal.

A third sound field controller for reproducing a sound field with presence according the present invention comprises an input unit for inputting an input audio signal having two channel signals, a signal extracting circuit for receiving and processing the input audio signals, and producing an extracted signal of the input audio signals, a signal processing circuit for receiving the extracted signal, and for adding a reflected sound signal and/or a reverberated signal signal to the extracting signal to produce a processed signal, an adding circuit for receiving the input audio signal and the processed signal, and adding the input audio signal and the processed signal with a predetermined summation ratio to produce a summed signal, and an output unit for reproducing the summed signal.

A fourth sound field controller for reproducing a sound field with presence according to the invention comprising an input unit for inputting an input audio signal having two channel signals, a signal processing circuit for receiving the input audio signals, and for adding a reflected sound signal and/or a reverberated sound signal to the input audio signal to produce a processed signal, an operation circuit for receiving the processed signal from the signal processing circuit, performing a convolution on the processed signal, and generating a convolution sum signal, an adding circuit for receiving the processed signal and the convolution sum signal, and adding the processed signal and the convolution sum signal with a predetermined summation ratio to produce a summed signal, and an output unit for reproducing the summed signal to localize a sound image in a desirable direction.

In one embodiment of the present invention, the operation circuit comprises a first, a second, a third, and a forth operation portions, the delay circuit comprises a first, a second, a third, and a forth delay elements, each delay element receiving the convolution sum signal from the corresponding operation portion, and the adding circuit comprises a first and a second adders, the first adder receiving the first channel signal of the input signal and the delayed signal from the first and the third delay elements, the second adders receiving the second channel signal of the input audio signal and the delayed signal from the second and the forth delay elements.

In another embodiment of the present invention, the sound field controller further comprises a signal judging circuit for receiving the input audio signal and judging whether the input audio signal is a voice signal or a non-voice audio signal and to output a detecting signal indicating the result, a correlation determining circuit for determining correlation ratio between the two channel signals of the input signal to output a determining signal, wherein, the adding circuit further receives the detecting signal and the determining signal, and adjusts the summation ratio based on the detecting signal and the determining signal.

In another embodiment of the present invention, the sound field controller further comprises a signal processing circuit for receiving the input audio signal, adding a reflected sound signal and/or a reverberated sound signal to the input audio signal to produce a processed signal, and applying the processed signal to the operation circuit.

In another embodiment of the present invention, the operation circuit comprises a first and a second operation portions, the delay circuit comprises a first, a second, a third, and a forth delay elements, the first and the second delay elements receiving the convolution sum signal from the first operation portion, the third and the forth delay elements receiving the convolution sum signal from the second operation portion, and the adding circuit comprises a first and a second adders, the first adder receiving the first channel signal of the input signal and the delayed signal from the first and the third delay elements, the second adder receiving the second channel signal of the input audio signal and the delayed signal from the second and the forth delay elements.

In another embodiment of the present invention, the sound field controller further comprises a signal processing circuit for receiving the input audio signal, adding a reflected sound signal and/or a reverberated sound signal to the input audio signal to produce a processed signal, and applying the processed signal to the operation circuit, the signal processing circuit including a first processing part for the first and the second operation portions and a second processing part for the third and the forth operation portions.

In another embodiment of the present invention, the sound field controller further comprises a signal judging circuit for receiving the input audio signal and judging whether the input audio signal is a voice signal or a non-voice audio signal and to output a detecting signal indicating the result, a correlation determining circuit for determining correlation ratio between the two channel signals of the input signal to output a determining signal wherein, the adding circuit further receives the detecting signal and the determining signal, and adjusts the summation ratio based on the detecting signal and the determining signal.

A fifth sound field controller for reproducing a sound field with presence according to the present invention comprising an input unit for inputting an input audio signal having a first and a second channel signals, a signal extracting circuit for receiving and processing the input audio signal, and producing a sum signal and a difference signal of the first and second channel signals, a signal processing circuit for receiving the sum signal and the difference signal, and for adding a reflected sound signal and/or a reverbration signal to the sum signal and the difference signal to produce a processed signal, an adding circuit for receiving the input audio signal the processed signal, and adding the input audio signal and the processed signal with a predetermined summation ratio to produce a summed signal, an output unit for reproducing the summed signal.

In one embodiment of the present invention, the sound field controller further comprises a signal judging circuit for receiving the input audio signal and judging whether the input audio signal is a voice signal or a non-voice audio signal and to output a detecting signal indicating the judged result, a correlation determining circuit for determining correlation ratio between the two channel signals of the input signal to output a determining signal, wherein, the signal processing circuit includes a first processing portion for receiving the sum signal, and for adding a reflected sound signal and/or a reverbrated sound signal to the sum signal to produce a first and a second processed signals; and a second processing portion for receiving the difference signal, and for adding a reflected sound signal and/or a reverberated sound signal to the difference signal to produce a third and a forth processed signals, the adding circuit includes a first adder for receiving the second channel signal and the first and the third processed signals, and for adding the second channel signal and the first and the third processed signals with a predetermined summation ratio to produce a first summed signal; and a second adder for receiving the first channel signal and the second and the forth processed signal, and for adding the first channel signal and the second and the forth processed signals with a predetermined summation ratio to produce a second summed signal, and the output circuit includes a first output portion for the first summed signal and a second output portion for the second summed signal.

In another embodiment of the present invention, the sound field controller further comprises signal mixing circuit, wherein, the signal processing circuit includes a first processing portion for receiving the sum signal, and for adding a reflected sound signal and/or a reverberated sound signal to the sum signal to produce a first and a second processed signal; and a second processing portion for receiving the difference signal, and for adding a reflected sound signal and/or a reverberated sound signal to the difference signal to produce a third and a forth processed signals, the adding circuit includes a first adder for receiving the first and the third processed signals, and for adding the first and the third processed signals with a predetermined summation ratio to produce a first output signal; and a second adder for receiving the second and the forth processed signals, and for adding the second and the forth processed signals with a predetermined summation ratio to produce a second output signal, the signal mixing circuit receives the first and the second output signals, subtracts the second output signal from the first output signal with a predetermined subtracting ratio to produce a first summed signal, and adds the first output signal to the second output signal with a predetermined summation ratio to produce a second summed signal, and the output circuit includes a first output portion for the first summed signal and a second output portion for the second summed signal.

In another embodiment of the present invention, the A sound field controller further comprises a signal judging circuit for receiving the input audio signal and judging whether the input audio signal is a voice signals or a non-voice audio signal and to output a detecting signal indicating the result, a correlation determining circuit for determining correlation ratio between the two channel signals of the input signal to output a determining signal, wherein, the signal mixing circuit further receives the detecting signal and the determining signal, and adjusts the summation ratio and the subtracting ratio based on the detecting signal and the determining signal.

Thus, the invention described herein makes possible the advantages of (1) providing a sound field controller which reprodoses a sound image including the reflection at a desirable position and direction without using any additional speakers on the sides or behind of the listener, and (2) providing a sound field controller in which the summation ratio of the surround signal (such as the reverberation and the reflection) and the input audio signal is appropriately adjusted so as to reproduce the surround signal effectively without making the main signal unclear.

These and other advantages of the present invention will become apparent to those skilled in the art upon reading and understanding the following detailed description with reference to the accompanying figures.

BRIEF DESCRIPTION OF THE DRAWINGS

FIG. 19A is a diagram showing a reflection series generated by one reflected sound generation shown in FIG. 18.

FIG. 19B is a diagram showing a reflection series generated by another reflected sound generation circuit shown in FIG. 18.

FIG. 19C is a diagram for explaining the method of reflection addition for a sound field controller according to the 13th embodiment of the invention.

DESCRIPTION OF THE PREFERRED EMBODIMENTS

The preferred embodiments of the present invention are described hereinbelow with reference to the accompanying figures.

EXAMPLE 1

Figure 1:
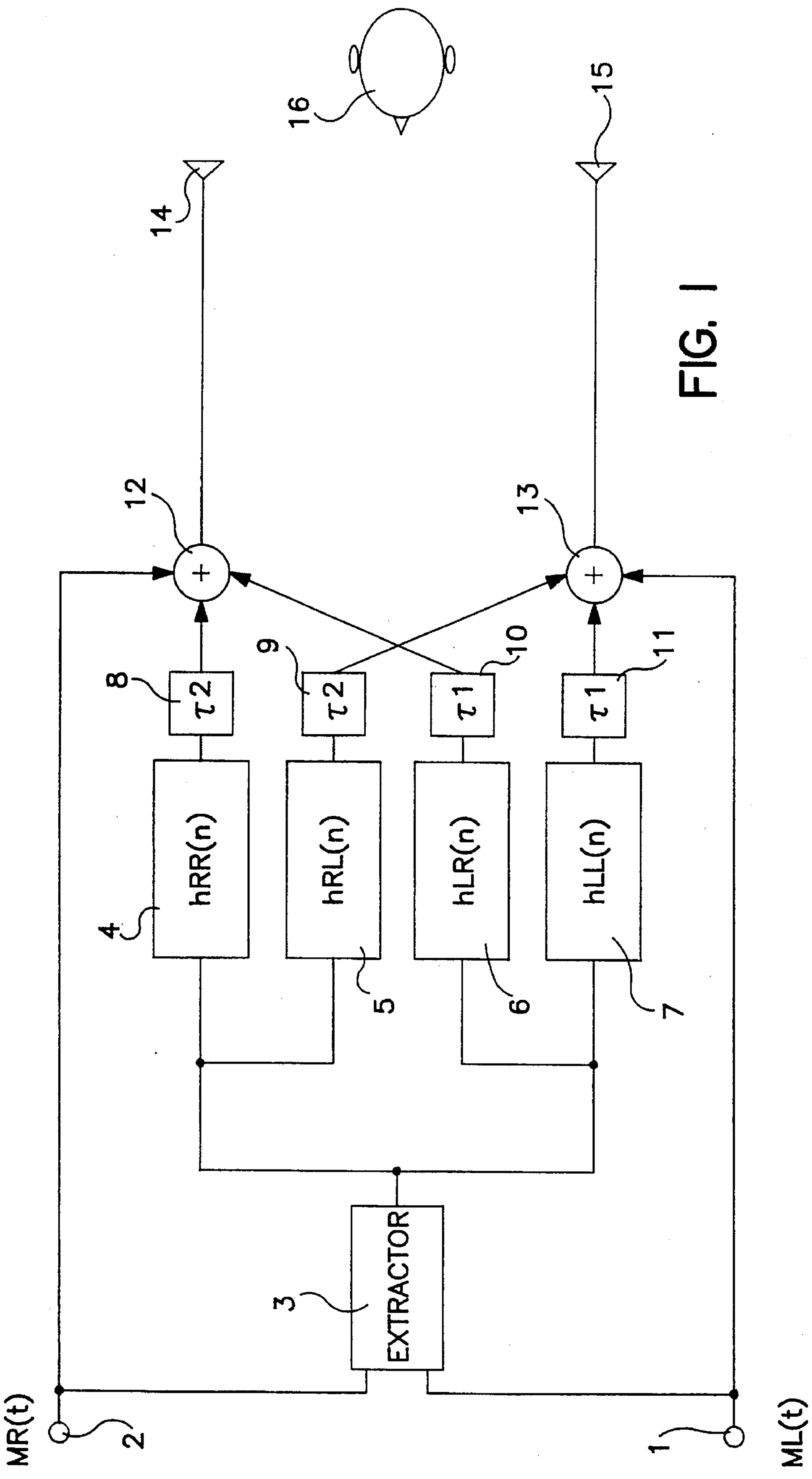
FIG. 1 is a hardware block diagram showing a sound field controller according to a first embodiment of the invention.
Figure 20:
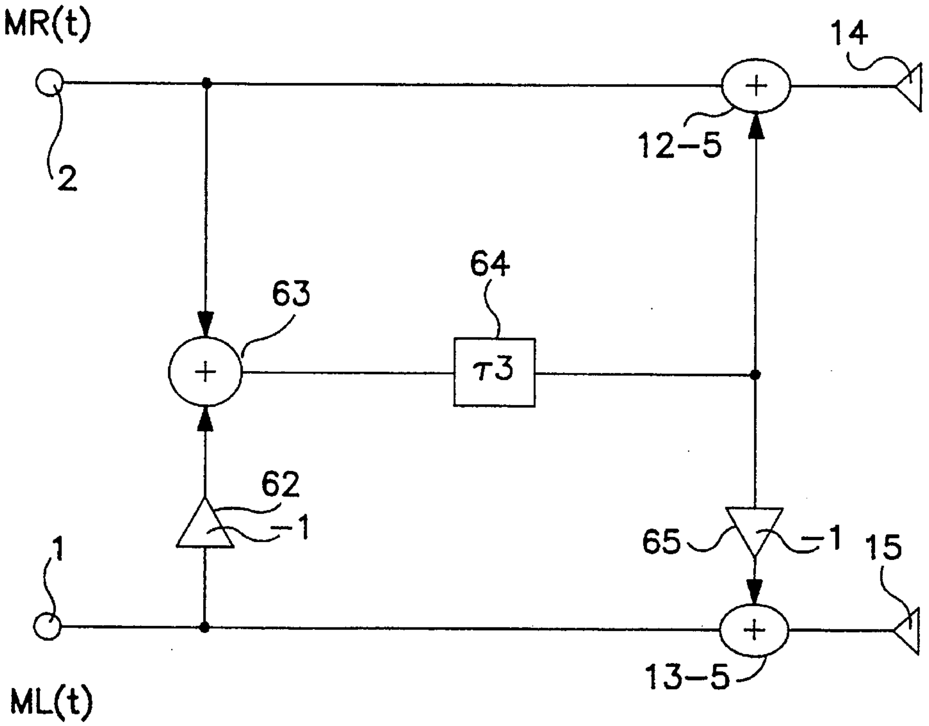
FIG. 20 PRIOR ART
FIG. 20 is a hardware block diagram showing a conventional sound field controller.
Figure 21:
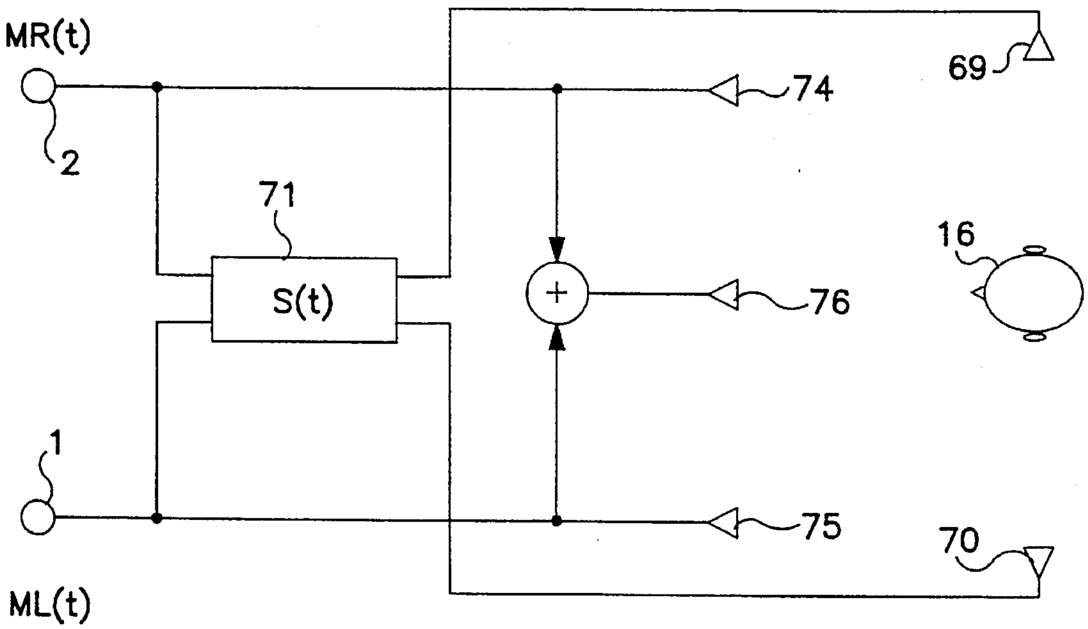
FIG. 21 PRIOR ART
FIG. 21 is a hardware block diagram showing another conventional sound field controller.

FIG. 1 shows a block diagram of a sound field controller according to the first example of the present invention. The circuits having the same functions as the corresponding parts of the conventional field controller are represented by the same reference numerals as those in FIGS. 20 and 21 and will not be described in detail.

In FIG. 1, a left-channel (hereinafter referred to as "Lch") signal ML(t) is applied to an input terminal 1 and a right-channel (hereinafter referred to as "Rch") signal MR(t) is applied to an input terminal 2. These signals are divided into two branches respectively. One of the branched signals of ML(t) and one of the branched signals of MR(t) are applied to a difference signal extractor 3 and the others to adders 13 and 12 respectively. The difference signal extractor 3 calculates the difference between the two signals applied thereto, and outputs the difference signal to operational circuits 4, 5, 6, and 7.

Each of the operational circuits 4 and 5 comprises an FIR filter having an impulse response, whereby the sound image being localized on the right side or right rear of the listener 16 by FIR filtering. Each of the operational circuits 6 and 7 comprises an FIR filter having an impulse response which allows the sound image to be localized on the left side or left rear of the listener 16 by convolution. In other words, the operational circuit 4 has an impulse response hRR(n), the operational circuit 5 an impulse response hRL(n), the operational circuit 6 an impulse response hLR(n), and the operational circuit 7 an impulse response hLL(n).

The output of the operational circuitry 4 is applied to the adder 12 via a delay circuit 8, the output of the operational circuit 5 to the adder 13 via a delay circuit 9, the output of the operational circuitry 6 to the adder 12 via a delay circuit 10, and the output of the operational circuitry 7 to the adder 13 through a delay circuit 11. The delay circuits 8 and 9 delay the input signals by the delay time $\tau_2$, and the delay circuits 10 and 11 delay the input signals by the delay time $\tau_1$. The adder 12 adds the signals output from the input terminal 2, the delay circuit 8, and the delay circuit 10 to each other at an arbitrary ratio. The adder 13 adds the signals output from the input terminal 1, the delay circuit 9, and the delay circuit 11 at an arbitrary ratio. The output signals of the adders 12 and 13 are applied to speakers 14 and 15 respectively. These signals are applied to the speakers 14 and 15 through respective power amplifiers (not shown in the figure) for amplifying the signals.

The operation of the sound field controller according to the first embodiment with above-mentioned structure will be explained below.

First, acoustic signals ML(t) and MR(t) of a voice, sound, or music is applied via the respective input terminals 1 and 2. Each of the input signals are divided into two branches respectively. One of the branched signals of ML(t) and one of the branched signals of MR(t) are applied to a difference signal extractor 3 and the others to adders 13 and 12 respectively. The difference signal extractor 3 calculates the difference between the two signals applied thereto, and outputs the difference signal to operational circuits 4, 5, 6, and 7.

In the difference signal calculated by the difference signal extractor 3, the centrally-localized signal may be substantially canceled and most of the components would be reverberation components of Lch and Rch signals which are inserted during recording or broadcasting. For example, when the input signals are music signals with the singing voice of a singer, the centrally-localized signal of the singer's voice signal is almost canceled by subtracting operation with the remainder of reverberation components in the difference signal. For this reason, the difference signal is sometimes called a surround signal. The operational circuits 6 and 7 perform the convolution on the input signal to localize the sound image on the left side or left rear.

Figure 2:
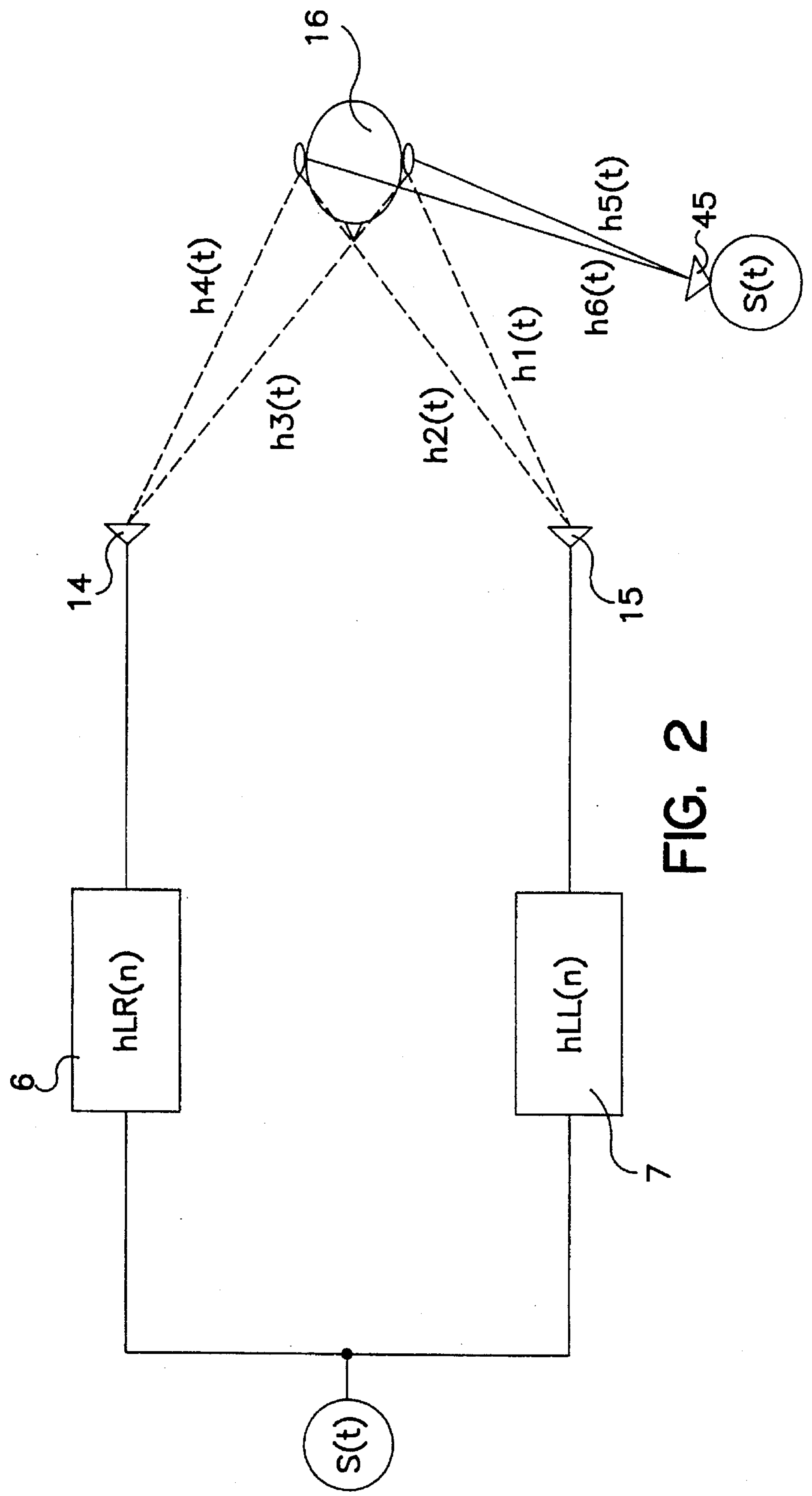
FIG. 2 is a block diagram for explaining the principle of an operation circuit of a sound field controller according to the first embodiment of the invention.

A method for virtually localizing the sound image in an arbitrary direction will be explained with reference to FIG. 2. FIG. 2 shows a diagram indicating the principle of virtually generating a sound image localization using the Lch speaker 15 and the Rch speaker 14, which is equivalent to a sound image localization generated from the signal reproduced from a left-side speaker 45. In FIG. 2, the speakers 14 and 15 are located on the left and right sides respectively in front of the listener 16. The input signal S(t) is applied to the operational circuits 6 and 7. The operational circuit 6 comprises an FIR filter for performing convolution with impulse responses hLR(n), and the operational circuit 7 comprises an FIR filter for performing convolution with impulse response hLL(n). In the diagram, h1(t) represents the impulse response at the left-ear position (more accurately, the position of the eardrum, or in the case of measurement, the entrance of the acoustic meatus) of the listener 16 when the speaker 15 produces an impulse sound. Similarly, h2(t) represents the impulse response at the right-ear position of the listener 16 when the speaker 15 produces the impulse sound. Also, h3(t) represents the impulse response at the left-ear position when the speaker 14 produces an impulse sound, h4(t) represents the impulse response at the right-ear position of the listener 16 when the speaker 14 produces the impulse sound, h5(t) represents the impulse response at the left-ear position of the listener 16 when the speaker 45 produces the impulse sound, and h6(t) represents the impulse response at the right-ear position of the listener 16 when the speaker 45 produces the impulse sound.

In this configuration, when the signal S(t) is produced from the speaker 45, the sound that reaches the ears of the listener 16 is expressed by the following equations:

Specifically, the sound pressure L(t) at the left ear is represented by Equation (1).

$$L(t)=S(t)*h5(t) \tag{1}$$

The sound pressure R(t) at the right ear is expressed as $$R(t)=S(t)*h6(t) \tag{2}$$

where * represents a convolution.

A transfer function of the speaker itself which is practically to be multiplied is ignored in the case under consideration. Alternatively, the transfer function of the speakers may be considered to be included in the impulse response functions.

Further, supposing that the sound pressures L(t) and R(t) given by Equations (1) and (2), the impulse responses h1(t) to h6(t), and the signal S(t) are all temporally discrete digital signals, they are converted to the formations as shown by the following expressions (3), (4), (5), (6) and (7).

$$L(t)\rightarrow L(n) \tag{3}$$

$$R(t)\rightarrow R(n) \tag{4}$$

$$h5(t)\rightarrow h5(n) \tag{5}$$

$$h6(t)\rightarrow h6(n) \tag{6}$$

$$S(t)\rightarrow S(n) \tag{7}$$

In this case, Equations (1) and (2) are expressed by following Equations (8) and (9) respectively.

$$L(n)=S(n)*h5(n)=\sum_{k=0}^{N-1} S(k)\cdot h5(n-k) \tag{8}$$

$$R(n)=S(n)*h6(n)=\sum_{k=0}^{N-1} S(k)\cdot h6(n-k) \tag{9}$$

It would be noted that the natural number n should actually be expressed by nT instead, T indicating a sampling time. However, T is omitted as usual and Equations (8) and (9) are written in the above-mentioned expression.

Similarly, when the signal S(t) is reproduced from the speakers 14 and 15, the sound which reaches the ears of the listener 16 is represented by following Equations (10) and (11). The sound pressure at the left ear is given by Equation (10).

$$L'(n)=S(n)*hLL(n)*h1(n)+S(n)*hLR(n)*h3(n) \tag{10}$$

The sound pressure at the right ear is expressed by Equation (11).

$$R'(n)=S(n)*hLL(n)*h2(n)+S(n)*hLR(n)*h4(n) \tag{11}$$

Assuming that the sounds are perceived as coming from the same direction if the head related transfer functions of the sounds are equivalent to each other (i.e. the direction from which sound is coming is determined based on the amplitude difference and the time difference between the sounds reaching the right and left ears, and this assumption is generally valid), Equations (12) to (15) hold as follows.

$$L(n)=L'(n) \tag{12}$$

$$h5(n)=hLL(n)*h1(n)+hLR(n)*h3(n) \tag{13}$$

$$R(n)=R'(n) \tag{14}$$

$$h6(n)=hLL(n)*h2(n)+hLR(n)*h4(n) \tag{15}$$

Thus, the impulse responses hLL(n) and hLR(n) may be determined so as to satisfy Equations (13) and (15).

The impulse responses h1(t) to h6(t) and hLL(t) to hLR(t) are rewritten in a frequency domain expression as shown by following Equations (16) to (23).

$$H1(n)=FFT(h1(n)) \tag{16}$$

$$H2(n)=FFT(h2(n)) \tag{17}$$

$$H3(n)=FFT(h3(n)) \tag{18}$$

$$H4(n)=FFT(h4(n)) \tag{19}$$

$$H5(n)=FFT(h5(n)) \tag{20}$$

$$H6(n)=FFT(h6(n)) \tag{21}$$

$$HLL(n)=FFT(hLL(n)) \tag{22}$$

$$HLR(n)=FFT(hLR(n)) \tag{23}$$

where FFT( ) represents a function transformed by Fourier transformation (FFT: Fast Fourier Transformer).

Next, Equations (13) and (15) are also rewritten in the frequency domain expression. The operation is transformed from a convolution to a multiplication as represented in Equations (24) and (25). The remaining parts are transformed to the transfer functions with the respective impulse responses by Fourier transformation.

$$H5(n)=HLL(n)\cdot H1(n)+HLR(n)\cdot H3(n) \tag{24}$$

$$H6(n)=HLL(n)\cdot H2(n)+HLR(n)\cdot H4(n) \tag{25}$$

In Equations (24) and (25), the values other than the transfer functions HLL(n) and HLR(n) are obtained by measurement. Therefore, the transfer functions HLL(n) and HLR(n) can be obtained from following Equations (26) and (27).

$$HLL(n)=\frac{H5(n)\cdot H4(n)-H6(n)\cdot H3(n)}{H1(n)\cdot H4(n)-H2(n)\cdot H3(n)} \tag{26}$$

-continued $$HLR(n)=\frac{H6(n)\cdot H1(n)-H5(n)\cdot H2(n)}{H1(n)\cdot H4(n)-H2(n)\cdot H3(n)} \qquad (27)$$

By using hLL(n) and hLR(n) obtained from HLL(n) and HLR(n) by preforming the inverse Fourier transformation (IFFT), and applying the signal S(n) to the operational circuits 6 and 7, the signal to be reproduced from the speaker 15 is obtained by performing the convolution with S(n) and hLL(n), and the signal to be produced from the speaker 14 is obtained by preforming the convolution with S(n) and hLR(n). When the convolution sum signals are reproduced and the corresponding sounds are output from the respective speakers 14 and 15, the listener can perceive the sounds as if the sound comes from the left speaker 45 that is not actually played.

The method described above can virtually localize the sound image in a desirable direction.

Figure 3:
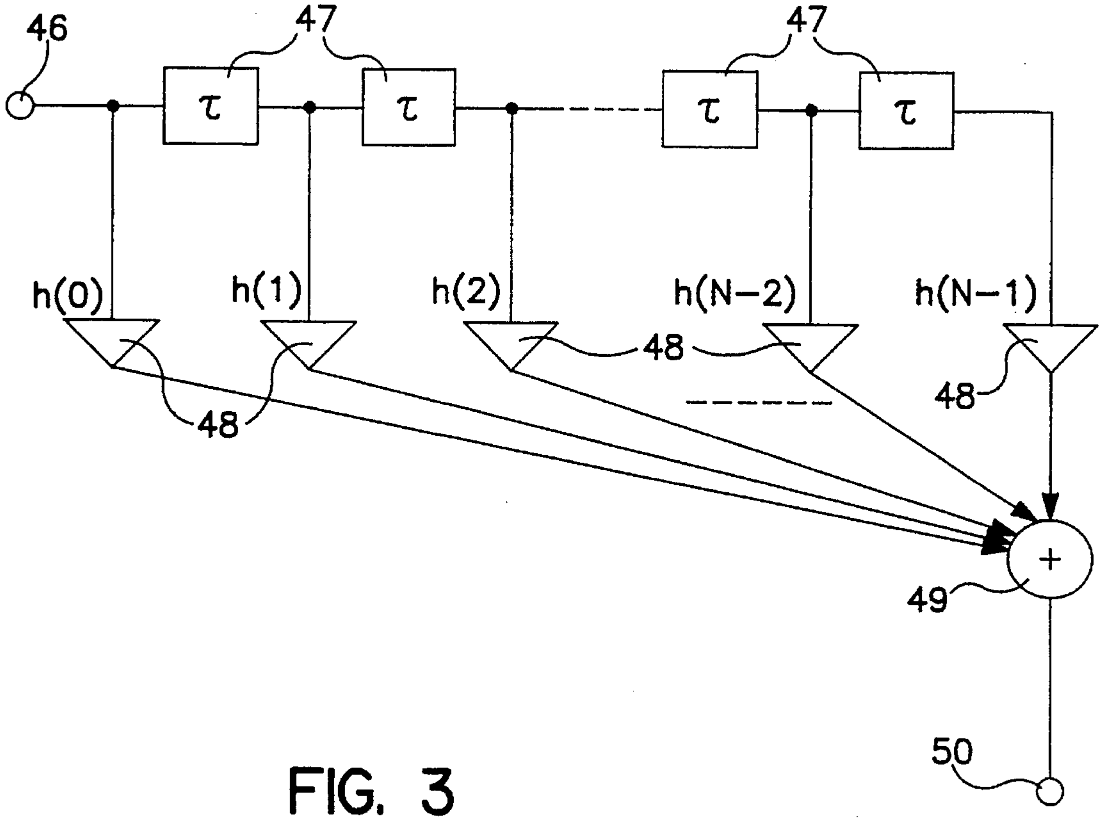
FIG. 3 is a diagram for explaining the structure of an operation circuit of a sound field controller according to the first embodiment of the invention.

An exemplary structure of an FIR filter for performing convolution is shown in FIG. 3. In FIG. 3, the signal is applied to a signal input terminal 46 and goes through serially connected N–1 delay elements 47. Each of delay elements 49 delays the signal by $\tau$, each of multipliers 48 multiplies the input signal by a value called the tap (a coefficient of FIR filter) indicated by h(n), an adder 49 adds all the signals output from the multipliers 48, and the added (sum) signal is output via an output terminal 50. Although the FIR filter shown in FIG. 3 is formed by hardware, the FIR filter may be implemented by using a DSP (Digital Signal Processor) or a custom LSI for high speed multiplication and addition operations.

The impulse responses h(n) (n: 0 to N–1, where N is the required length of the impulse response) are set up as the tap coefficients of the respective multipliers 48 as shown in FIG. 3. Also, a delay time corresponding to the sampling frequency of converting an analog signal to a digital signal is set up in each of the delay elements 47. The signals applied to the input terminal 46 are multiplied/added/delayed repeatedly, thereby the convolution as shown in Equations (8) and (9) is performed. This operation involves digital signals. In practice, therefore, an A/D converter and a D/A converter are to be provided in order to convert analog signals to digital signals before being applied to the FIR filter, and to convert the digital signal output from the FIR filter to an analog signal (these converters are not shown in the figures as is the case in the following descriptions).

The impulse response hLL(t) and hLR(t) are obtained in the above mentioned manner, and the sound image is localized on the left side or left rear by using the operational circuits 6 and 7 with a phantom speaker from which the sound is perceived to come.

Similarly, the operational circuits 4 and 5 perform the convolution on the input signals so as to localize the sound image on the right side or right rear.

The output signals from the operational circuits 4 and 5 are applied to the delay circuits 8 and 9 respectively and delayed by $\tau_1$. The output signals from the operational circuits 6 and 7 are applied to the delay circuits 10 and 11 respectively, and delayed by $\tau_2$. An optimal amount of the delay time is about 10 msec. with respect to the input signal, the amount being empirically obtained. An optimal difference between the delay times $\tau_1$ and $\tau_2$ is also experimentally obtained with an amount of about 10 msec. The difference between the delay times $\tau_1$ and $\tau_2$ in the respective phantoms to be localized on the left side and right side allows the phantoms to be distinguished as to whether a phantom is localized on the left side or the right side.

In the next step, the output signals from the delay circuits 8 and 10 are applied to the adder 12, added to the signal MR(t) input from the input terminal 2, and mixed with the signal MR(t) at a desirable ratio by the adder 12. Similarly, the output signals from the delay circuits 9 and 11 are applied to the adder 13, added to and mixed with the signal ML(t) input from the input terminal 1 at an desirable ratio. The resulting signals are acoustically reproduced by the speakers 14 and 15 respectively.

EXAMPLE 2

Figure 4:
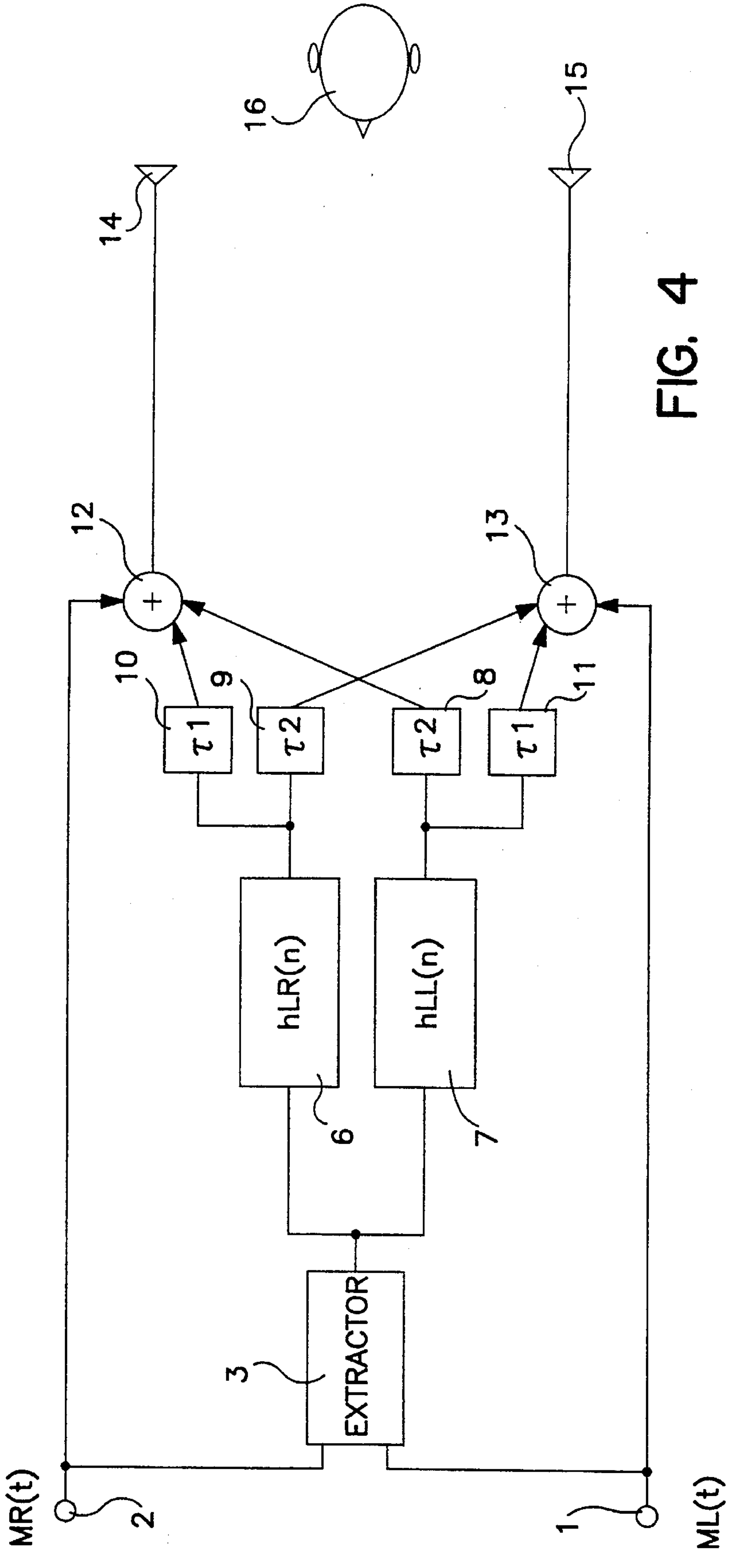
FIG. 4 is a hardware block diagram showing a sound field controller according to a second embodiment of the invention.

A sound field controller according to a second example of the present invention will be explained with reference to FIG. 4. FIG. 4 shows a block diagram of the structure of a sound field controller according to the second example. Circuits having the same functions as the corresponding parts of the sound controller in the first example are represented by the same reference numerals and will not be described in detail.

In FIG. 4, the signals ML(t) and MR(t) applied to the respective input terminals 1 and 2. These signals are divided into two branches respectively. One of the branched signals of ML(t) and one of the branched signals of MR(t) are applied to a difference signal extractor 3 and the others to adders 13 and 12 respectively. The difference signal extractor 3 calculates the difference between the two signals applied thereto, and outputs the difference signal to operational circuits 6 and 7.

Each of the output signals of the operational circuits 6 and 7 is divided into two branches. Two output signals of the operational circuit 6 are applied to the delay circuits 9 and 10, and two output signals of the operational circuit 7 is applied to the delay circuits 8 and 11. The output signals from the delay circuits 8 and 10 are applied to the adder 12, while the output signals from the delay circuits 9 and 11 are applied to the adder 13.

The delay circuits 8 and 9 delay the input signals by the delay time $\tau_2$, and the delay circuits 10 and 11 delay the input signals by the delay time $\tau_1$. The adder 12 adds the input signal MR(t) from the input terminal 2, and the output signals from the delay circuits 8 and 10 at an arbitrary ratio. The adder 13 adds the input signal ML(t) from the input terminal 1, and the output signals from the delay circuits 9 and 11 at an arbitrary ratio. The output signals of the adders 12 and 13 are applied to and produced from speakers 14 and 15 respectively.

In this example, the sound field controller comprises only two operational circuits, each of the output signals form the operational circuits being applied to two delay circuits.

By setting the two impulse responses hLL(t) and hLR(t) inversely in the respective signals which are to be reproduced from the speakers 14 and 15, the sound image can be localized rightward or leftward in simple manner. For example, to localize the sound image at the right side with respect to the listener, the signals delayed by $\tau_2$ via the delay circuit 8 and 9 are applied crosswise to the adders 12 and 13. These are two same signals which were used for localizing the sound image at left side.

The above-mentioned configuration is based on the assumption that the impulse responses at the left and right ears of the listener are laterally symmetric. As a result, it is possible to reduce the size of the operational circuits for localizing the left and right sound images by applying one branched signal of the operational circuit straight to the corresponding adder and the other crosswise to the other adder as shown in FIG. 4.

EXAMPLE 3

Figure 5:
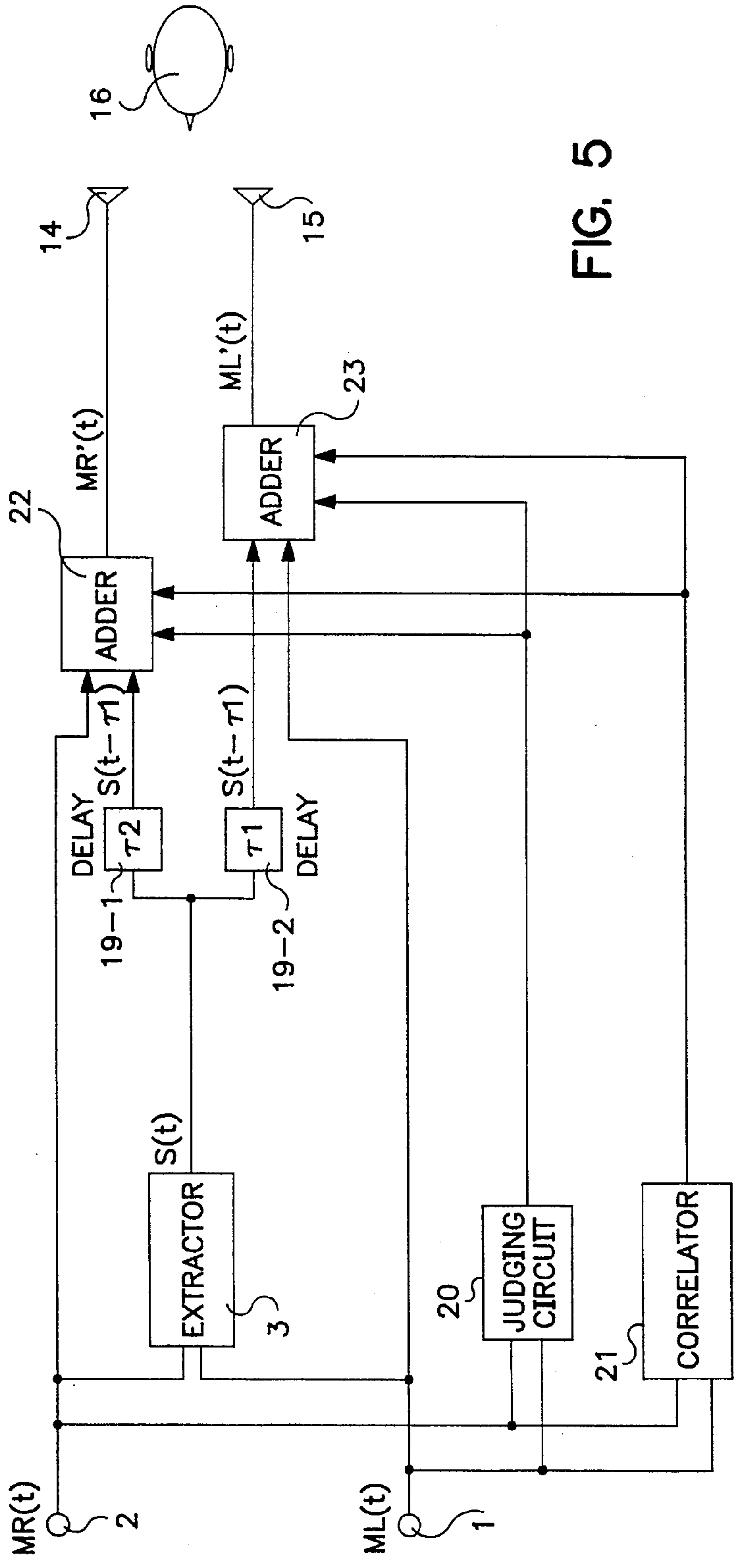
FIG. 5 is a hardware block diagram showing a sound field controller according to a third embodiment of the invention.

A sound field controller according to a third example of the invention will be explained with reference to FIG. 5. FIG. 5 shows a block diagram of the structure of a sound field controller according to the third embodiment. Circuits having the same functions as the corresponding parts of the sound field controller in the first and second examples are represented by the same reference numerals and will not be described in detail.

In FIG. 5, the signals ML(t) and MR(t) are applied to the respective input terminals 1 and 2. These signals are divided into three branches respectively. One of the branched signals of ML(t) and one of the branched signals of MR(t) are applied to a difference signal extractor 3 and converted into the difference signal S(t), and the resulting signal S(t) is applied to delay circuits 19-1 and 19-2. The delay circuits 19-1 and 19-2 delay the difference signal S(t) by the delay times $\tau_2$ and $\tau_1$ respectively. The other branched signals of ML(t) and MR(t), are applied to a signal judging circuit 20 and a correlator 21.

The signal judging circuit 20 detects a blank period (i.e. a silent interval where the signal is essentially zero) of the input signal, and judges whether the input signal is a voice signal or non-voice signal. The correlator 21, on the other hand, is a circuitry for determining the correlation ratio between input signals MR(t) and ML(t). An output signal $S(t-\tau_1)$ from the delay circuit 19-2, and a output signal $S(t-\tau_2)$ from the delay circuit 19-1 are applied to adders 23 and 22 respectively. The adders 23 and 22 add the input signals thereto with respective ratios based on the calculated result obtained from the signal judging circuit 20 and the correlator 21. The resulting signals MR'(t) and ML'(t) are produced from the speakers 14 and 15 respectively.

The operation of the sound field controller according to the third example will be described as to the different portions from the previous examples.

The signal judging circuit 20 adds the input signals MR(t) and ML(t) to obtain a sum signal, detects the frequency of the blank periods (i.e. how frequently the signal interruptions occur) in the sum signal, and judges whether the input signal is a voice signal or not according to the frequency of the blank periods.

Figure 6:
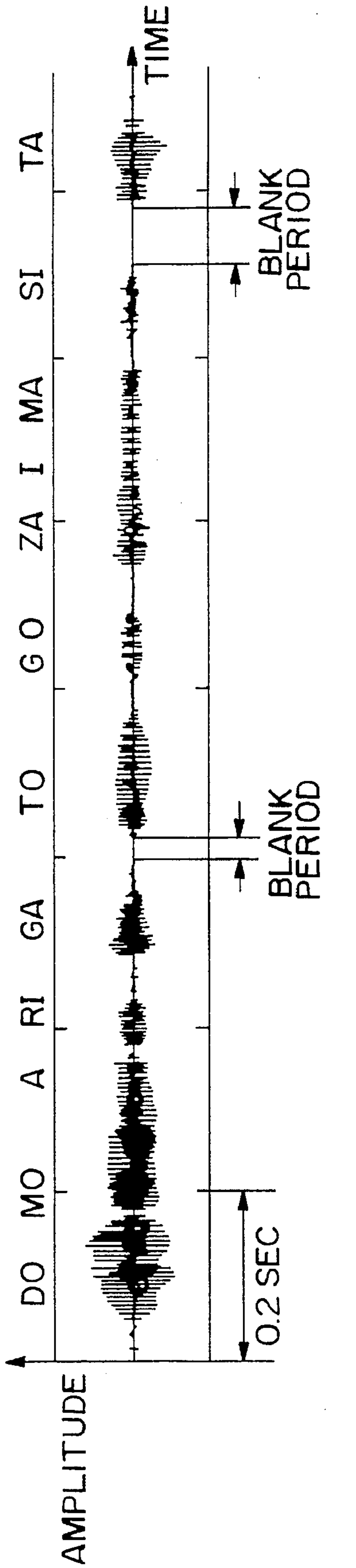
FIG. 6 is a diagram for explaining the principle of a signal decision circuit for a sound field controller according to the third embodiment of the invention.

FIG. 6 shows a waveform of the voice signal. In FIG. 6, the horizontal axis of the coordinate represents the time and the vertical axis of the coordinate represents the amplitude. This sound wave was obtained from the spoken words "DOMO ARIGATO GOZAIMASITA (Thank you very much)" in Japanese as indicated over the waveform. As can seen known from FIG. 6, there will always be a certain number of blanks (silent periods) within a certain period of time in a voice signal (in this example there are two blanks in a 1 second period). The signal judging circuit 20 uses this property of the voice signal to determine whether the input signal is a voice signal or a non-voice audio signal based on the blank period frequency, and controls the summation ratio of the adders 22 and 23.

A judging value A is set as follows:

for a non-voice audio signal: $A=(A+\Delta A)$ for a voice signal: $A=(A-\Delta A)$ where ΔA is a constant for varying the amount of the judging value according to whether the signal is a voice signal or not.

When the input signal is determined to be a non-voice audio signal, the judging value A is increased by the constant ΔA, while when the input signal is determined to be a voice signal, the judging value A is decreased by the constant ΔA. This operation is successively repeated at a predetermined interval and the judging value A is updated at each judgment. In this manner, the input signal is judged by variation ΔA of the judging value A from a previously judged value, and not judged by the values 0 or 1 for each judgment. This updating method allows the sound-field controller to handle judging error to prevent any significant effect on the output signals. The judging value A thus determined is applied to the adders 22 and 23.

The correlator 21 calculates the correlation ratio between the input signals according to following Equation (28) as described below.

$$\alpha = \frac{|ML(t) - MR(t)|}{|ML(t) + MR(t)|} \tag{28}$$

In the case where the input 2ch signals are a monaural signal or an approximately monaural signal (i.e. the 2ch signals MR(t) and ML(t) are strongly correlated each other), the nominator of the equation is zero or decreases to zero, and the value αA becomes nearly zero. When the input 2ch signals are a stereo signal (i.e. the 2ch signals MR(t) and ML(t) have no or little correlation each other), the nominator increases.

The summation ratio of the signals in the adders 22 and 23 is controlled based on the values obtained by the signal judging circuit 20 and the correlator 21.

The adders 22 and 23 perform summation expressed in the following equations:

$$MR'(t)=MR(t)\cdot(1-\alpha\cdot A)+S(t-\tau_2)\cdot\alpha\cdot A \tag{29}$$

$$ML'(t)=ML(t)\cdot(1-\alpha\cdot A)+S(t-\tau_1)\cdot\alpha\cdot A \tag{30}$$

where MR'(t) and ML'(t) are output signals from the adders 22 and 23, respectively. In these equations, the summing ratios of ML(t), MR(t), and the respective surround signal $S(t-\tau_1)$ and $S(t-\tau_2)$ are adjusted to produce a natural presence. In other words, the correlation ratio between the input signals is small (i.e. giving a listener a large stereophonic feeling), the signal processed by the difference signal extractor 3 is reproduced large, while when the correlation ratio between the input signals is large (i.e. giving a listener a small stereophonic feeling), the signal processed by the difference signal extractor 3 is reproduced small. Further, the voice signal may be reproduced clearly since the judgment of the input signal to be a voice signal or not is performed at the same time and the summation ratio is adjusted.

Although α given by Equation (28) is used with a direct form in Equations (29) and (30), in practice, the value α may be converted into a value in a range of 0 to 1. Further, this value may be varied depending on a desirable magnitude of the stereophonic effects.

In this example, ML(t) and MR(t) are multiplied by a factor $(1-\alpha\cdot A)$ in order to suppress the change in the total volume of ML'(t) and MR'(t) according to the change of the value α. However, when the total volume is allowed to change, the input signal is not required to be multiplied by $(1-\alpha\cdot A)$.

The value $\alpha\cdot A$ is updated at a timing with certain time intervals, since the updating operation may cause a fluctuation in the effect.

The value α indicating the correlation ratio may be used in another form of correlation value instead of the exact form. Similarly to the voice judging value A, the correlation value B may be defined as:

when $\alpha>X$, $B=(B+\Delta B)$ when $\alpha<X$, $B=(B-\Delta B)$ where X is a predetermined value and ΔB a constant for varying the correlation value B. The operation using this correlation value is also able to prevent the output signals from fluctuations caused by the updating timing of αA or an erroneous judgment.

According to this example, the input signal is judged to be a voice signal or a non-voice signal by the signal judging circuit 20 based on the frequency of the blank periods. Alternatively, other methods may be used for judgment such as a determining method base on the inclination of the envelope of a rising edge or falling edge of the input signal waveform, or a combination of this determining method with the method in this example.

In this example, the sum signal of the input signals is judged by the signal judging circuit 20. Alternatively, each input signal may be judged without summation.

EXAMPLE 4

Figure 7:
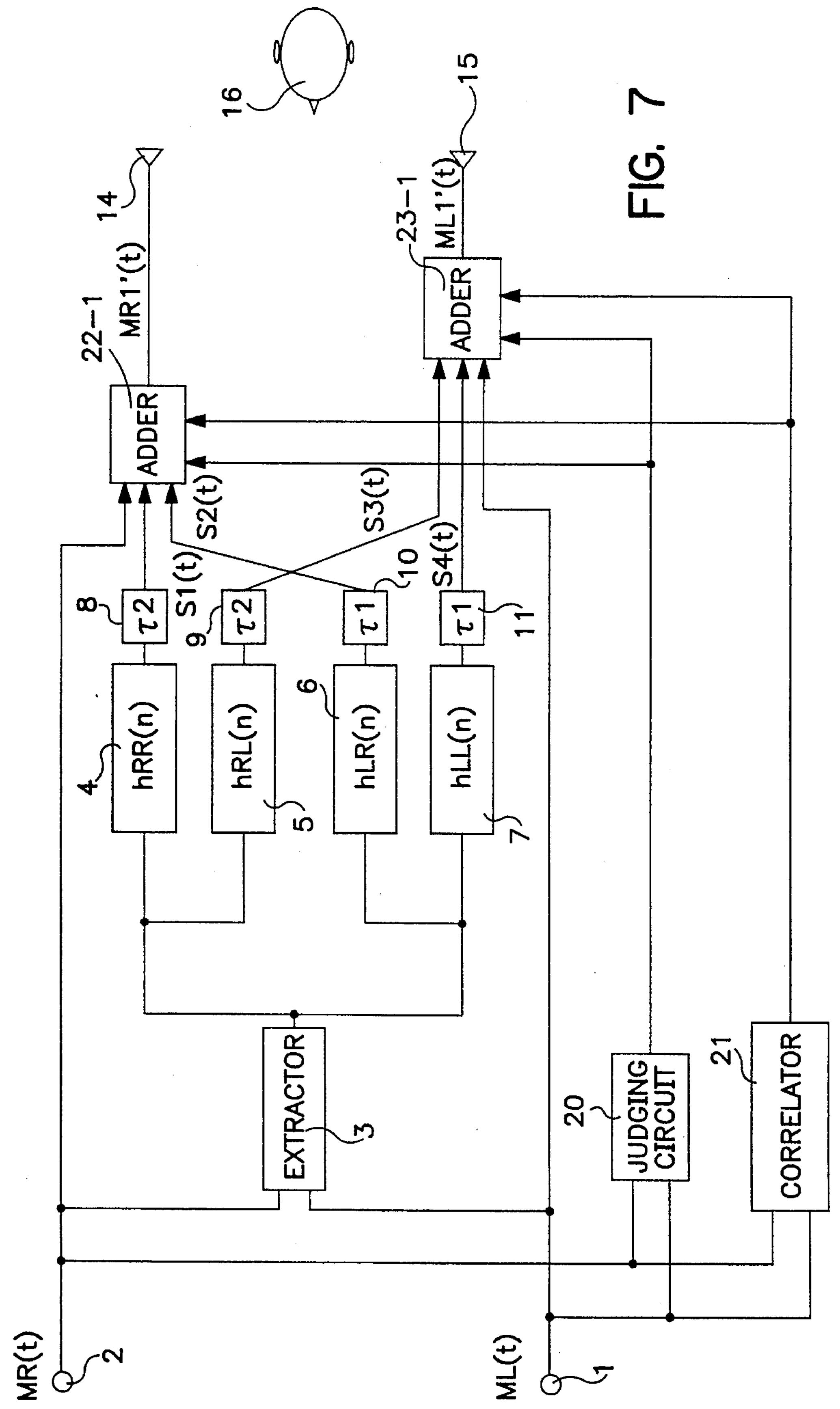
FIG. 7 is a hardware block diagram showing a sound field controller according to a fourth embodiment of the invention.

A sound field controller according to the fourth example of the invention will be explained with reference to FIG. 7. FIG. 7 shows a block diagram of the structure of a sound field controller according to the fourth example. The circuits having the same functions as the corresponding parts of the sound field controller in the previous examples are represented by the same reference numerals and will not be described in detail.

In FIG. 7, an Lch signal ML(t) is applied to an input terminal 1 and an Rch signals MR(t) is applied to an input terminal 2. These signals are divided into branches respectively. One of the branched signals of ML(t) and one of the branched signal of MR(t) are applied to a difference signal extractor 3 and the others to adders 22-1 and 23-1 respectively. The difference signal extractor 3 calculates the difference between the two signals applied thereto, and outputs the difference signal to operational circuits 4, 5, 6, and 7.

The other branched signals of ML(t) and MR(t) are applied to a signal judging circuit 20 and a correlator 21.

The signal judging circuit 20 detects any blank period of the input signal, and judges whether the input signal is a voice signal or a non-voice signal. The correlator 21, on the other hand, is a circuit for determining the correlation ratio between input signals MR(t) and ML(t).

The respective output signals S1(t), S2(t), S3(t), and S4(t) of the operational circuits 4, 5, 6, and 7 are applied to the adders 22-1 and 23-1 via the delay circuits 8, 9, 10, and 11.

The adder 22-1 weights and adds the input signals from the input terminal 2, the delay circuit 8, and the delay circuit 10 with respective ratios based on the calculated result obtained from the signal judging circuit 20 and the correlator 21. The adder 23-1 weights and adds the input signals from the input terminal 1, the delay circuit 9, and the delay circuit 11 with respective ratios based on the calculated result obtained from the signal judging circuit 20 and the correlator 21. The output signals MR1'(t) and ML1'(t) from the adders 22-1 and 23-1 are reproduced from the speakers 14 and 15 respectively.

The operation of the sound field controller according to the forth example will be described as to the different portions from the previous examples.

This example is similar to the first example except for the signal judging circuit 20 and the correlator 21. And the signal judging circuit 20 and the correlator 21 operate the same way as that of the corresponding components of the third example. The operation of the adders 22-1 and 23-1, however, is somewhat different from that of the third example.

The adder 22-1 performs the summing operation according to the following equation:

$$MR1'(t)=MR(t)\cdot(1-\alpha\cdot A)+(S1(t)+S2(t))\cdot\alpha\cdot A \qquad (31)$$

In a similar manner, the adder 23-1 performs summing operation as shown in following equation:

$$ML1'(t)=ML(t)\cdot(1-\alpha\cdot A)+(S3(t)+S4(t))\cdot\alpha\cdot A \qquad (32)$$

The operations of other circuits are similar to those of the previous examples. Also, in order to simplify the structure of the sound field controller, the circuits other than the signal judging circuit 20, the correlator 21, and the adders 22-1 and 23-1 may be modified to the corresponding circuits as described in the second example.

EXAMPLE 5

Figure 8:
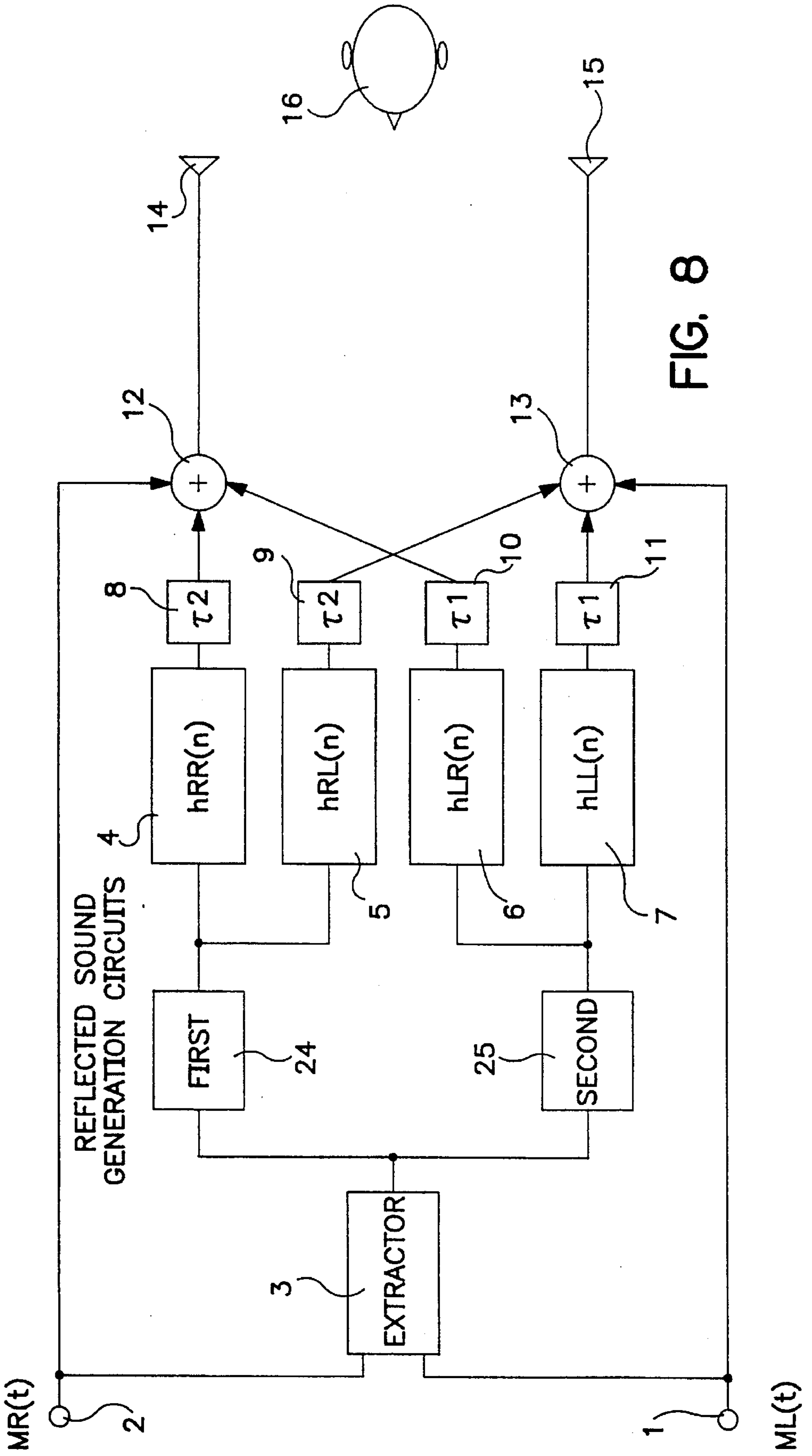
FIG. 8 is a hardware block diagram showing a sound field controller according to a fifth embodiment of the invention.

A sound field controller according to the fifth example of the invention will be explained with reference to the figures. FIG. 8 shows a block diagram of the structure of a sound field controller according to the fifth example. The circuits having the same functions as the corresponding parts of the sound field controller in the previous examples are represented by the same reference numerals and will not be described in detail.

In FIG. 8, an Lch signal ML(t) is applied to an input terminal 1 and an Rch signal MR(t) is applied to an input terminal 2. These signals are divided into two branches respectively. One of the branched signals of ML(t) and one of the branched signals of MR(t) are applied to a difference signal extractor 3 and the others to adders 12 and 13 respectively. The difference signal extractor 3 calculates the difference between the two signals applied thereto. The output signal of the difference signal extractor 3 is supplied to reflected sound generation circuits 24 and 25 which generates a reflection and a reverberation by simulating the sound field in a music hall, etc. The outputs of the reflected sound generation circuit 24 is applied to the operational circuits 4 and 5. The reflected sound generation circuit 25 is applied to the operational circuits 6 and 7.

The output signals of the operational circuits 4 and 6 are applied to the adder 12 via the delay circuits 8 and 10 respectively. The output signals of the operational circuits 5 and 7 are applied to the adder 13 via the delay circuits 9 and 11 respectively. The outputs of the delay circuits 9 and 10 are cross-wise applied to the adders 12 and 13.

The adder 12 adds the input signals from the input terminal 2, the delay circuit 8, and the delay circuit 10 with respective ratios, while the adder 13 adds the input signals from the input terminal 1, the delay circuit 9, and the delay circuit 11 with respective ratios. The output signals from the adders 12 and 13 are reproduced from the speakers 14 and 15 respectively.

The operation of the sound field controller according to the fifth example will be described as to the different portions from the previous examples.

The difference signal produced from the difference signal extractor 3 is applied to the reflected sound generation circuits 24 and 25. The reflected sound generation circuits 24 and 25 generate a reflection or a reverberation obtained by simulating the sound field in a music hall, etc.

Figure 9A:
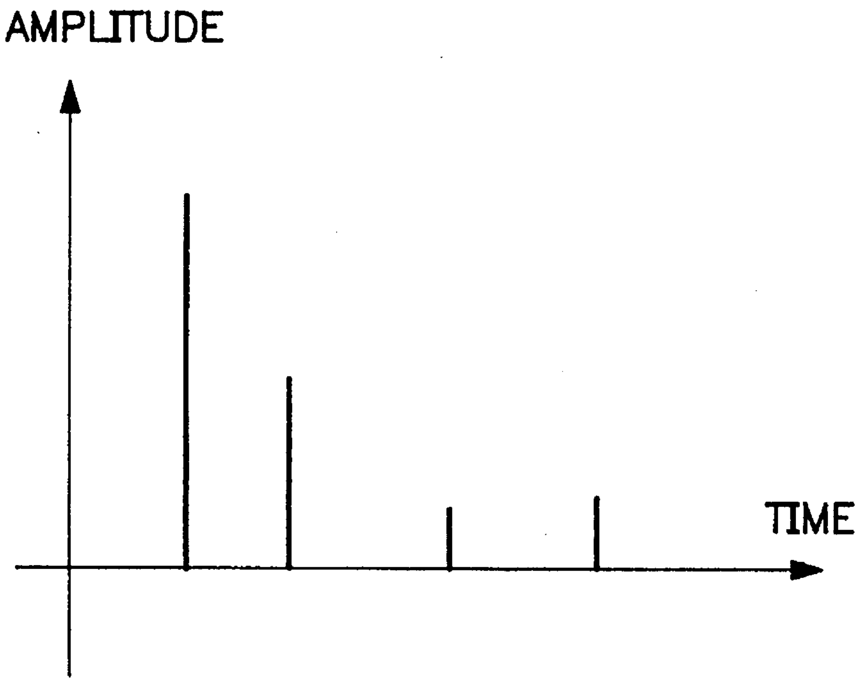
FIGS. 9A and 9B are a diagrams for explaining the method of reflection addition for a sound field controller according to the fifth embodiment of the invention.
Figure 9B:
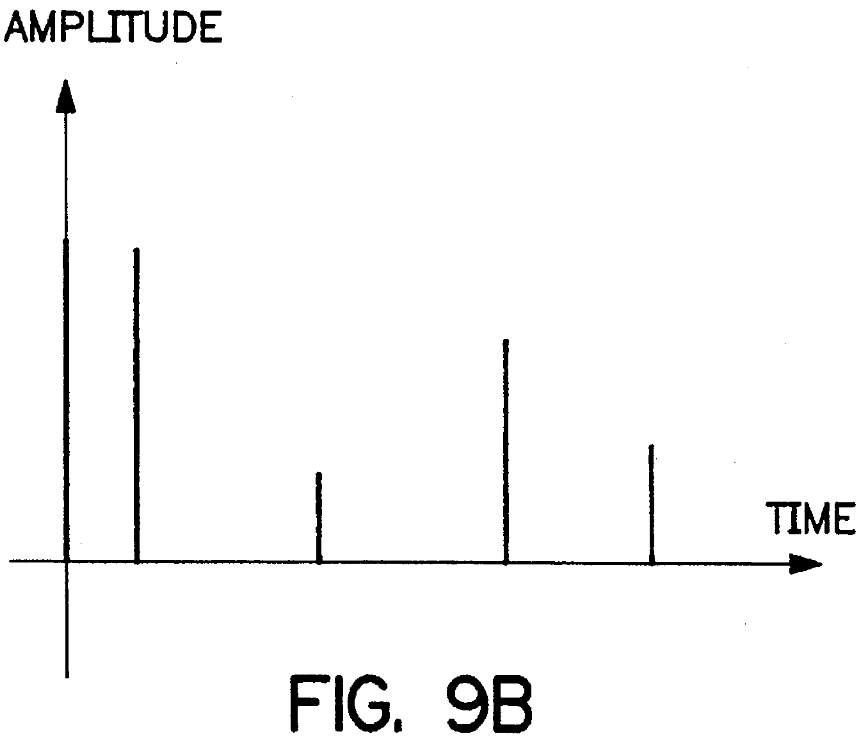

FIGS. 9A and 9B schematically show a reflection series generated by the reflected sound generation circuits 24 and 25. The horizontal axis of the coordinate represents the time, and the vertical axis of the coordinate represents the amplitude. These reflection series are determined by measurement in an actual music hall or by simulation utilizing the sound ray method.

Figure 10A:
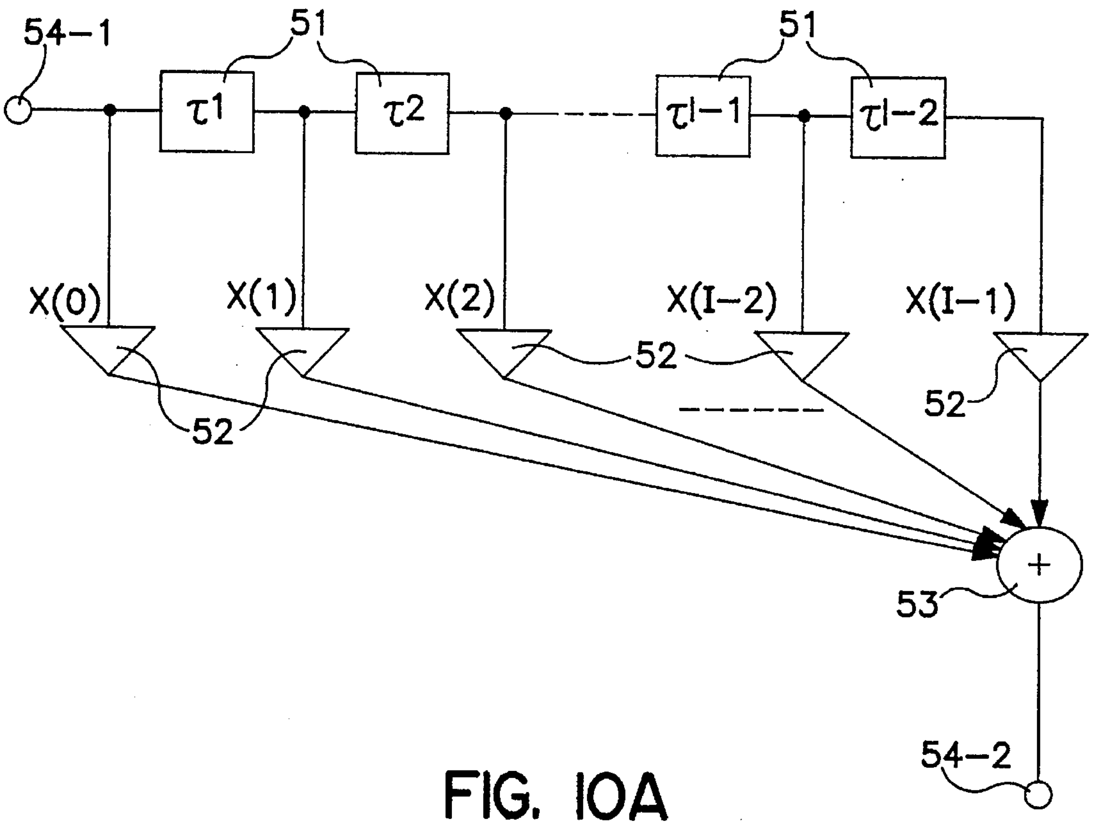
FIG. 10A is a block diagram for explaining the structure of a reflected sound generation circuit for a sound field controller according to the fifth embodiment of the invention.
Figure 10B:
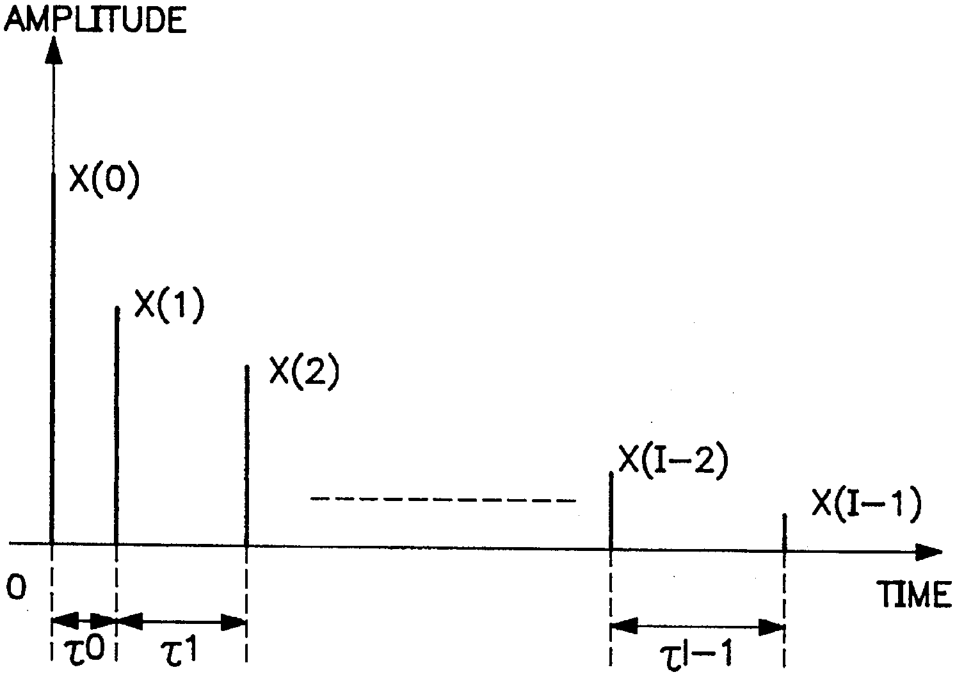
FIG. 10B is a diagram showing a reflection series generated by the reflected sound generation circuit shown in FIG. 10A.

FIGS. 10A and 10B show diagrams for explaining the reflected sound generation circuits 24 and 25. An exemplary structure of the reflected sound generation circuits 24 and 25 is shown in FIG. 10A. In FIG. 10A, the signal is applied to a signal input terminal 50-1 and goes through a serially connected I−1 delay elements 51. Each of delay elements 51 delays the signal by $\tau_i$ (i represents a suffix number as in all the following cases), each of multipliers 52 multiplies the input signal by a value called the tap coefficient indicated by X(i), an adder 53 adds all the signals output from each multiplier (called a tap) 52, and the added (sum) signal is output via an output terminal 54-2.

The above-mentioned operation is expressed with digital signals. When analog signals are handled in practice, an A/D converter and a D/A converter are to be provided in order to convert the analog signals to digital signals before being applied to the reflected sound generation circuits 24 and 25, and to convert the digital signals output from the reflected sound generation circuits 24 and 25 to analog signals (these converters are not shown in the figures).

These reflected sound generation circuits 24 and 25 comprise the delay elements 51 and the tap 52 as described above, similarly to the operational circuits 4, 5, 6 and 7 in the first example. In this example, each of the delay elements 51 can delay the input signal by respective values of the delay time $\tau_i$, which may vary in each delay circuit. By setting the delay times $\tau_i$ and the tap coefficients X(i) appropriately, a desirable reflection series such as shown in FIGS. 9A, 9B, and 10B are generated by the reflected sound generation circuits 24 and 25.

The reflected sound generation circuits 24 and 25 may be implemented by using a dynamic random access memory (DRAM) and a digital signal processor (DSP), or the like. Since the reflected sound generation circuits 24 and 25, and the operational circuits 4, 5, 6, and 7 are configured in the same manner, the functional characteristics of the reflected sound generation circuits 24 and 25 can be included in those of the operational circuits 4, 5, 6, and 7. As mentioned above, by adding the reflected sound signal to the difference signal (surround signal), the surround feeling given by the difference signal can be emphasized.

The operations of other circuits are similar to those of the previous examples. Also, to simplify the structure of the sound field controller, the circuits other than the signal judging circuit 20, the correlator 21, the reflected sound generation circuits 24 and 25 may be modified to the corresponding circuits as described in the second example.

EXAMPLE 6

Figure 11:
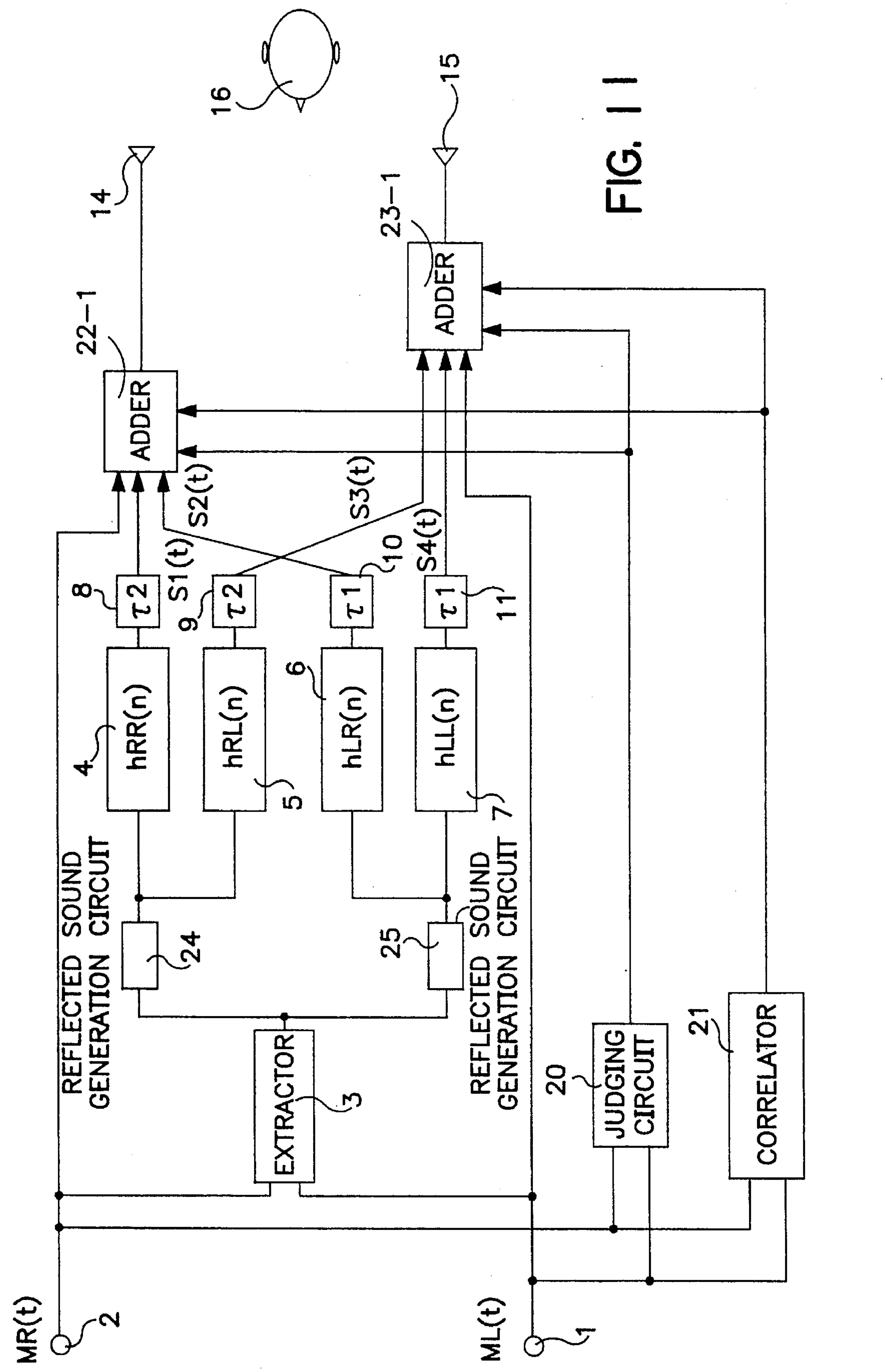
FIG. 11 is a hardware block diagram showing a sound field controller according to a sixth embodiment of the invention.

A sound field controller according to the sixth example of the invention will be explained with reference to FIG. 11. FIG. 11 shows a block diagram of the structure of a sound field controller according to the sixth example. The circuits having the same functions as the corresponding parts of the sound field controller in the previous examples are represented by the same reference numerals and will not be described in detail.

In FIG. 11, an Lch signal ML(t) is applied to an input terminal 1 and an Rch signal MR(t) is applied to an input terminal 2. These signals are divided into branches respectively. One of the branched signals of the ML(t) and one of the branched signals of the MR(t) are applied to a difference signal extractor 3 and the others to adders 22-1 and 23-1 respectively. The difference signal extractor 3 calculates the difference between the two signals applied thereto. The output signal of the difference signal extractor 3 is supplied to reflected sound generation circuits 24 and 25 which generate a reflection and a reverberation by simulating the sound field in a music hall, etc. The output of the reflected sound generation circuit 24 is applied to operational circuits 4 and 5. The output of the reflected sound generation circuit 25 is applied to operational circuits 6 and 7.

Other branched signals of the ML(t) and the MR(t) are applied to a signal judging circuit 20 and a correlator 21.

The signal judging circuit 20 detects a blank period of the input signal, and judges whether the input signal is a voice signal or a non-voice audio signal. The correlator 21, on the other hand, is a circuit for determining the correlation ratio between input signals MR(t) and ML(t).

The respective output signals S1(t), S2(t), S3(t), and S4(t) of the operational circuits 4, 5, 6, and 7 are applied to the adders 22-1 and 23-1 via the delay circuits 8, 9, 10, and 11 respectively.

The adder 22-1 weighs and adds the input signals from the input terminal 2, the delay circuit 8, and the delay circuit 10 with respective ratios based on the calculated result obtained from the signal judging circuit 20 and the correlator 21. The adder 23-1 weighs and adds the input signals from the input terminal 1, the delay circuit 9, and the delay circuit 11 with respective ratios based on the calculated result obtained from the signal judging circuit 20 and the correlator 21. The output signals from the adders 22-1 and 23-1 are reproduced from the speakers 14 and 15 respectively.

The operation of the sound field controller according to the sixth example is similar to that of the forth example except for the signals input to the operational circuits 4, 5, 6, and 7, each of the signals being a sum signal of the difference signal from the difference signal extractor 3 and the reflected sound signal produced by the reflected sound generation circuit 24 or 25.

EXAMPLE 7

Figure 12:
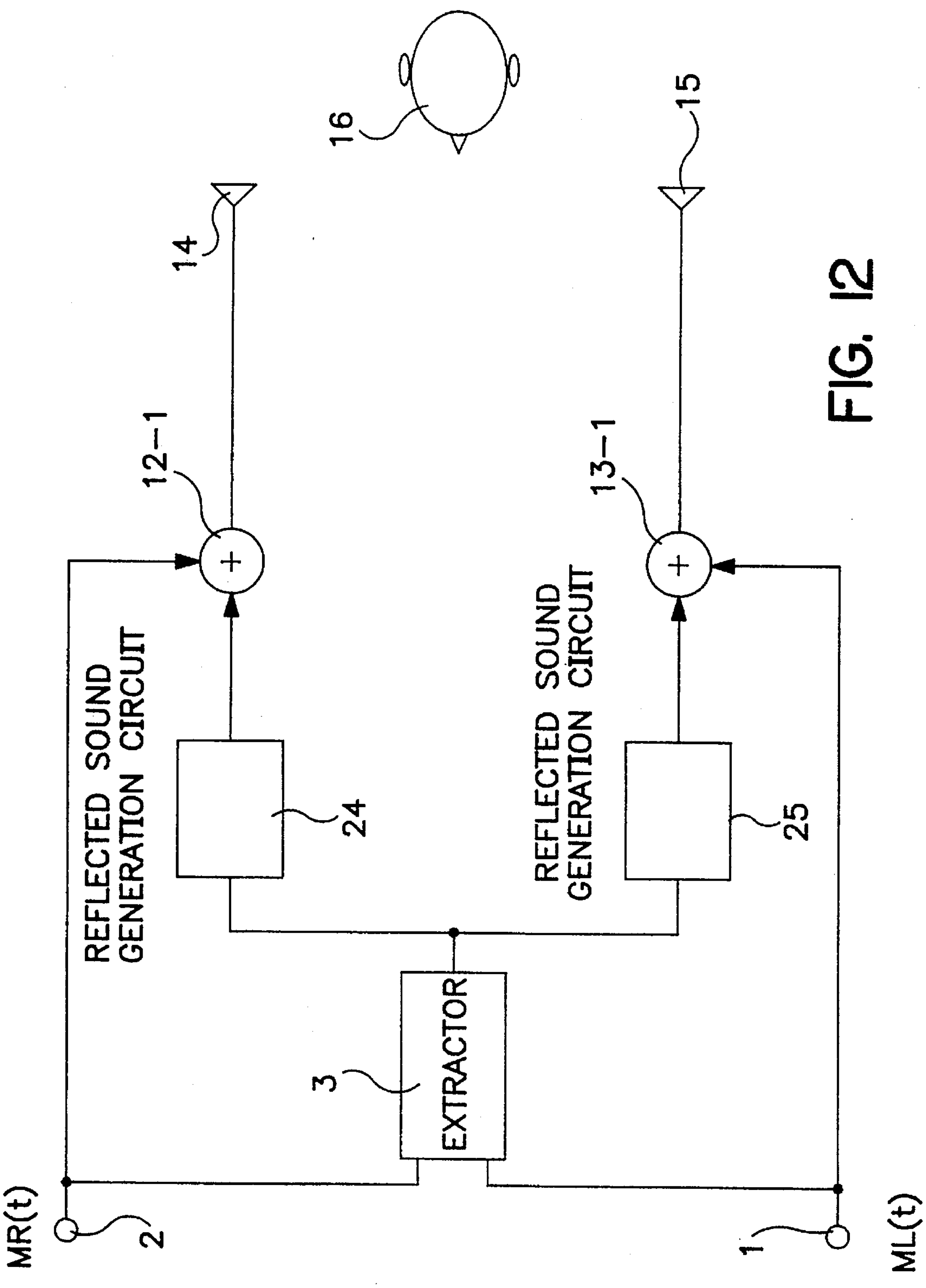
FIG. 12 is a hardware block diagram showing a sound field controller according to a seventh embodiment of the invention.

A sound field controller according to the seventh example of the invention will be explained with reference to FIG. 12. FIG. 12 shows a block diagram of the structure of a sound field controller according to the seventh example. The circuits having the same functions as the corresponding parts of the sound field controller in the previous examples are represented by the same reference numerals and will not be described in detail.

In FIG. 12, an Lch signal ML(t) is applied to an input terminal 1 and an Rch signal MR(t) is applied to an input terminal 2. These signals are divided into two branches respectively. One of the branched signals of the ML(t) and one of the branched signals of the MR(t) are applied to a difference signal extractor 3 and the others to adders 12-1 and 13-1 respectively. The difference signal extractor 3 calculates the difference between the two signals applied thereto. The output signal of the difference signal extractor 3 is supplied to reflected sound generation circuits 24 and 25 which generate a reflection and a reverberation by simulating the sound field in a music hall, etc. The output of the reflected sound generation circuit 24 is applied to the adder 12-1, and the output of reflected sound generation circuit 25 is applied to the adder 13-1. The speakers 14 and 15 reproduce the signals output from the adders 12-1 and 13-1 respectively.

The difference signal produced by the difference signal extractor 3 is added with a reflected sound signal by the reflected sound generation circuits 24 and 25. The adder 12-1 sums the signal applied to the input terminal 2 and the output signal of the reflected sound generation circuit 24. The sum signal is reproduced by the speaker 14. In a similar way, the adder 13-1 sums the signal applied to the input terminal 1 and the output signal of the reflected sound generation circuit 25. The sum signal is reproduced by the speaker 15.

EXAMPLE 8

Figure 13:
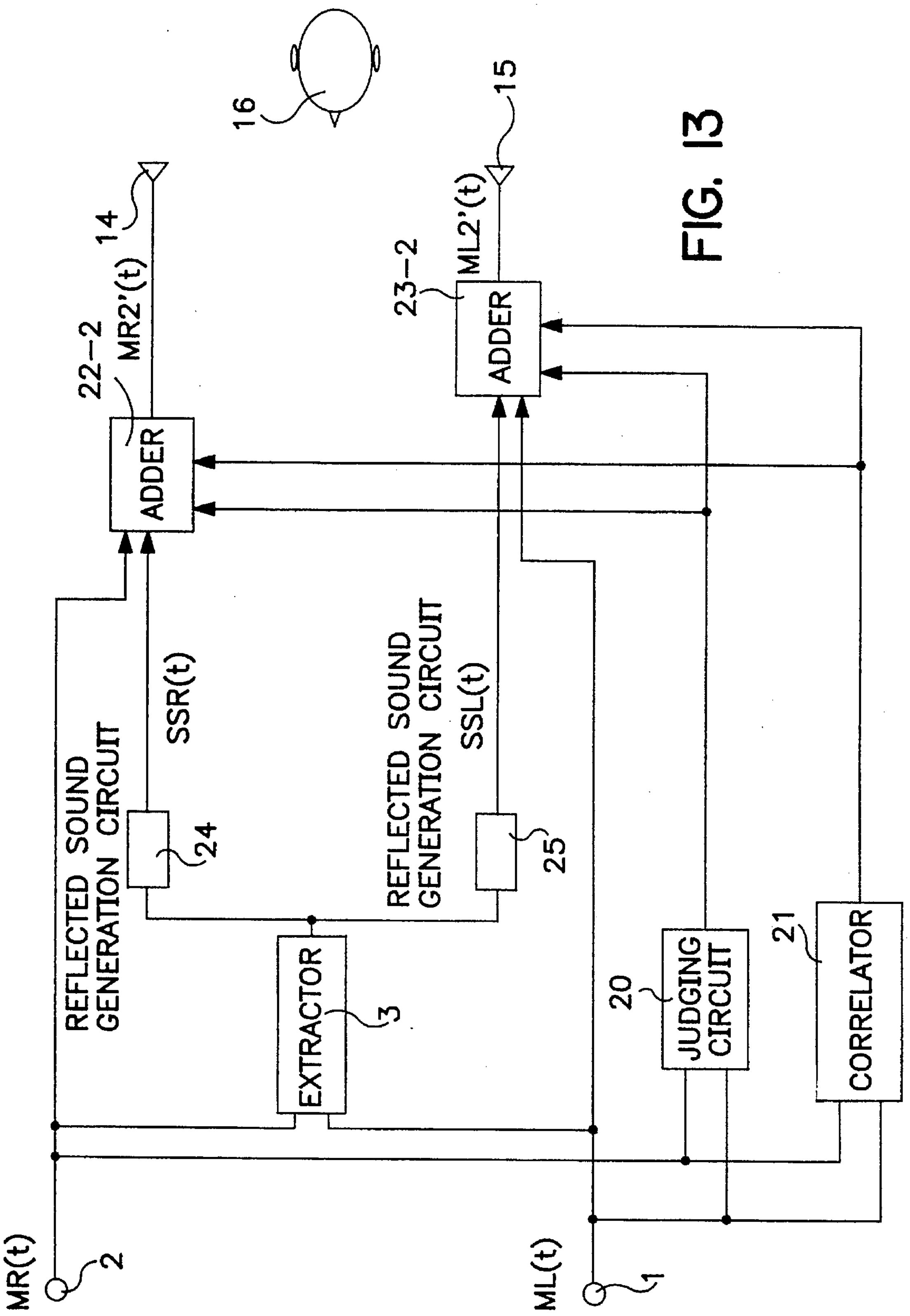
FIG. 13 is a hardware block diagram showing a sound field controller according to an eighth embodiment of the invention.

A sound field controller according to the eighth example of the invention will be explained with reference to FIG. 13. FIG. 13 shows a block diagram of the structure of a sound field controller according to the eight example. The circuits having the same functions as the corresponding parts of the sound field controller in the previous examples are represented by the same reference numerals and will not be described in detail.

In FIG. 13, an Lch signal ML(t) is applied to an input terminal 1 and an Rch signal MR(t) is applied to an input terminal 2. These signals are divided into branches respectively. One of the branched signals of the ML(t) and one of the branched signals of the MR(t) are applied to a difference signal extractor 3 and the others to adders 22-2 and 23-2 respectively. The difference signal extractor 3 calculates the difference between the two signals applied thereto. The output signal of the difference signal extractor 3 is supplied to reflected sound generation circuits 24 and 25 which generate a reflection and a reverberation by simulating the sound field in a music hall, etc. The output signal SSR(t) of the reflected sound generation circuit 24 is applied to the adder 22-2, and the output signal SSL(t) of the reflected sound generation circuit 25 is applied to the adder 23-2. The speakers 14 and 15 reproduce the signals MR2'(t) and ML2'(t) output from the adders 22-2 and 23-2 respectively.

Other branched signals from ML(t) and MR(t) are applied to a signal judging circuit 20 and a correlator 21. The signal judging circuit 20 detects any blank period in the input signal, and judges whether the input signal is a voice signal or a non-voice audio signal. The correlator 21, on the other hand, is a circuit for determining the correlation ratio between input signals MR(t) and ML(t).

The adder 22-2 weights and adds the input signal MR(t) from the input terminal 2 and the signal SSR(t) from the reflected sound generation circuit 24 with a respective ratio based on the calculated result obtained from the signal judging circuit 20 and the correlator 21. The adder 23-2 weights and adds the input signal ML(t) from the input terminal 1 and the signal SSL(t) from the reflected sound generation circuit 25 with a respective ratio based on the calculated result obtained from the signal judging circuit 20 and the correlator 21. The output signals MR2'(t) and ML2'(t) from the adders 22-2 and 23-2 are reproduced from the speakers 14 and 15 respectively.

The operation of the sound field controller according to the eighth example will be described as to the different portions from the previous examples. The summation operation is performed according to the equations below in a manner similar to the third embodiment.

$$MR2'(t)=MR(t)\cdot(1-\alpha\cdot A)+SSR(t)\cdot\alpha\cdot A \quad (33)$$

$$ML2'(t)=ML(t)\cdot(1-\alpha\cdot A)+SSL(t)\cdot\alpha\cdot A \quad (34)$$

The sum signal MR2'(t) and ML2'(t) output from the adders 22-2 and 23-2 are applied to the speakers 14 and 15 respectively.

EXAMPLE 9

Figure 14:
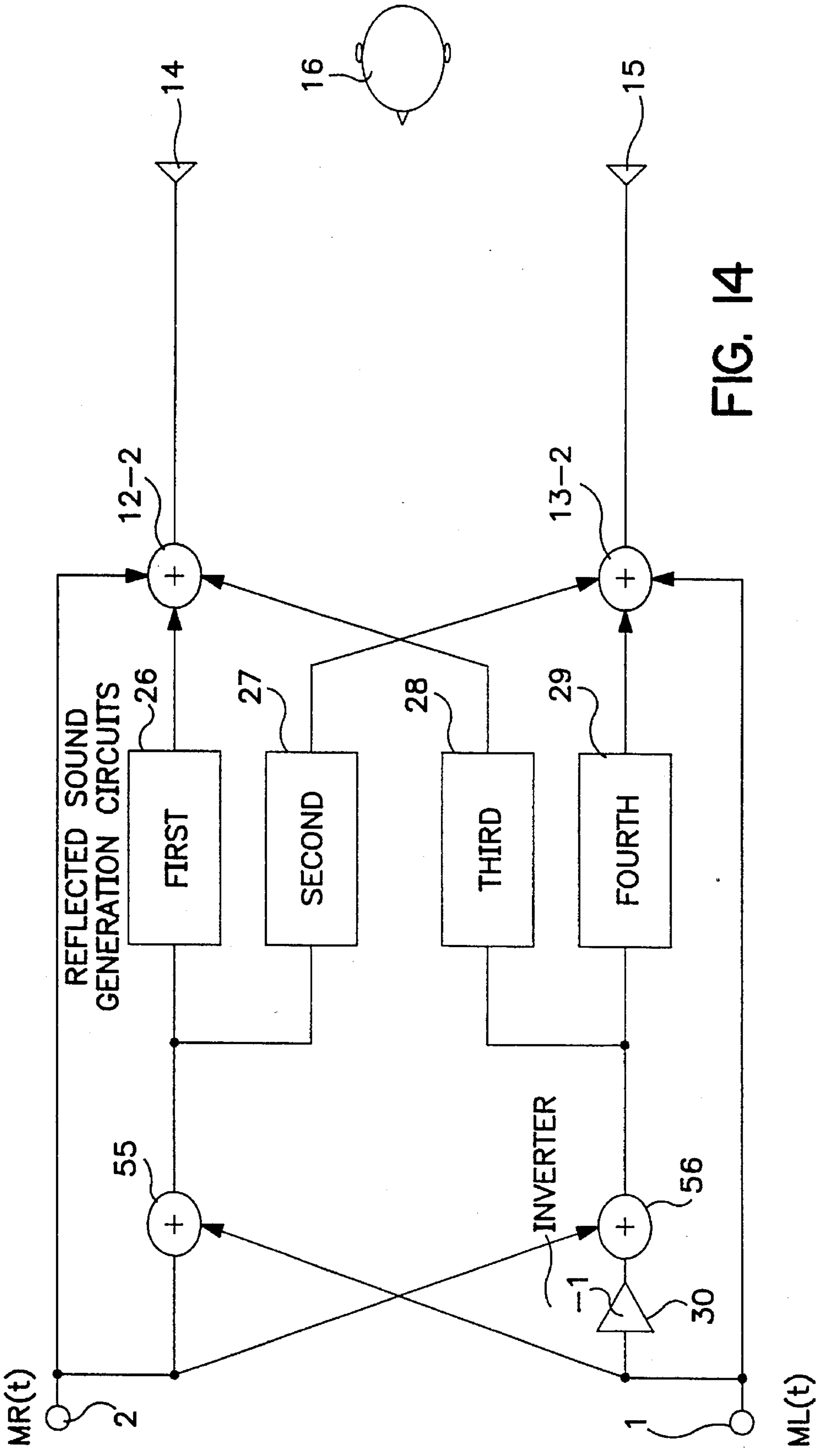
FIG. 14 is a hardware block diagram showing a sound field controller according to a ninth embodiment of the invention.

A sound field controller according to the ninth example of the invention will be explained with reference to FIG. 14. FIG. 14 shows a block diagram of the structure of a sound field controller according to the ninth example. The circuits having the same functions as the corresponding parts of the sound field controller in the previous examples are represented by the same reference numerals and will not be described in detail.

In FIG. 14, an Lch signal ML(t) is applied to an input terminal 1 and an Rch signal MR(t) is applied to an input terminal 2. These signals are divided into branches respectively. The branched signals of the ML(t) are applied to the adder 13-2, an adder 55, and a multiplier circuit 30, respectively. The branched signals of MR(t) are applied to the adder 12-2, the adder 55, and an adder 56, respectively. The multiplier circuit 30 multiplies the input signal by −1, and the output signal from multiplier circuit 30 is applied to the adder 56. The adder 56 sums the signal MR(t) applied to the input terminal 2 and the output signal from the multiplier circuit 30. The adder 55 sums the signal ML(t) applied to the input terminal 1 and the signal MR(t) applied to the input terminal 2.

The output signal of the adder 55 is supplied to reflected sound generation circuits 26 and 27 which generate a reflection and a reverberation by simulating the sound field in a music hall, etc. The output signal of the adder 56 is supplied to reflected sound generation circuits 28 and 29 which generate a reflection and a reverberation by simulating the sound field in a music hall, etc. The reflected sound generation circuits 26 and 27 add the reflection to the output of the adder 55. The reflected sound generation circuits 28 and 29 add the reflection to the output of the adder 56. The outputs of the reflected sound generation circuits 26 and 28 are applied to the adder 12-2, and the outputs of the reflected sound generation circuits 27 and 29 are applied to the adder 13-2.

The adder 12-2 adds the input signal MR(t) from the input terminal 2 and the signals from the reflected sound generation circuits 26 and 28. The adder 13-2 adds the input signal ML(t) from the input terminal 1 and the signals from the reflected sound generation circuits 27 and 29. The output signals from the adders 12-2 and 13-2 are reproduced by the speakers 14 and 15 respectively.

The operation of the sound field controller according to the ninth example will be described as to the different portions from the previous examples.

The adder 56 adds MR(t) and −ML(t), outputting the resulting signal MR(t)−ML(t). In other words, the multiplier 30 and the adder 56 constitute a difference signal extraction means. The output from the adder 56 is divided into two portions which are applied to the reflected sound generation circuits 28 and 29 respectively. The reflection is added to MR(t)−ML(t) and the resulting signal is applied to the adders 12-2 and 13-2.

Similarly, the adder 55 adds the signal MR(t) and ML(t) to generate a sum signal MR(t)+ML(t). That is, the adder 55 functions as a sum signal generation means. The output from the adder 55 is divided into two portions, each applied to the reflected sound generation circuits 26 and 27. The reflection is added to MR(t)+ML(t) and resulting signal is applied to the adders 12-2 and 13-2 respectively. The reflected sound generation circuits 26, 27, 28, and 29 have a similar function as the reflected sound generation circuits 24 and 25 described in the fifth example.

By providing the reflected sound generation circuits and adding the reflection to the difference signal and/or the sum signal of the input signals as described above, a sound field can be reproduced with natural expansion and natural presence without the antiphase feeling. Convoluting the reflection into the sum signal of the input signals makes the expansion and presence of the reproduced sound field more effective and more natural. Further, providing two reflected sound generation circuits for each channel makes it possible to reproduce a sound field in which the signals produced from the speakers 14 and 15 have different reflections. That is to say, the reflection can be added in stereo. Further, by varying the amount of delay time of the delay circuit or changing the coefficient of the multiplier in the reflected sound generation circuit, various sound fields such as a sound field with plenty of reverberation or that with little amount of reflection can be reproduced.

EXAMPLE 10

Figure 15:
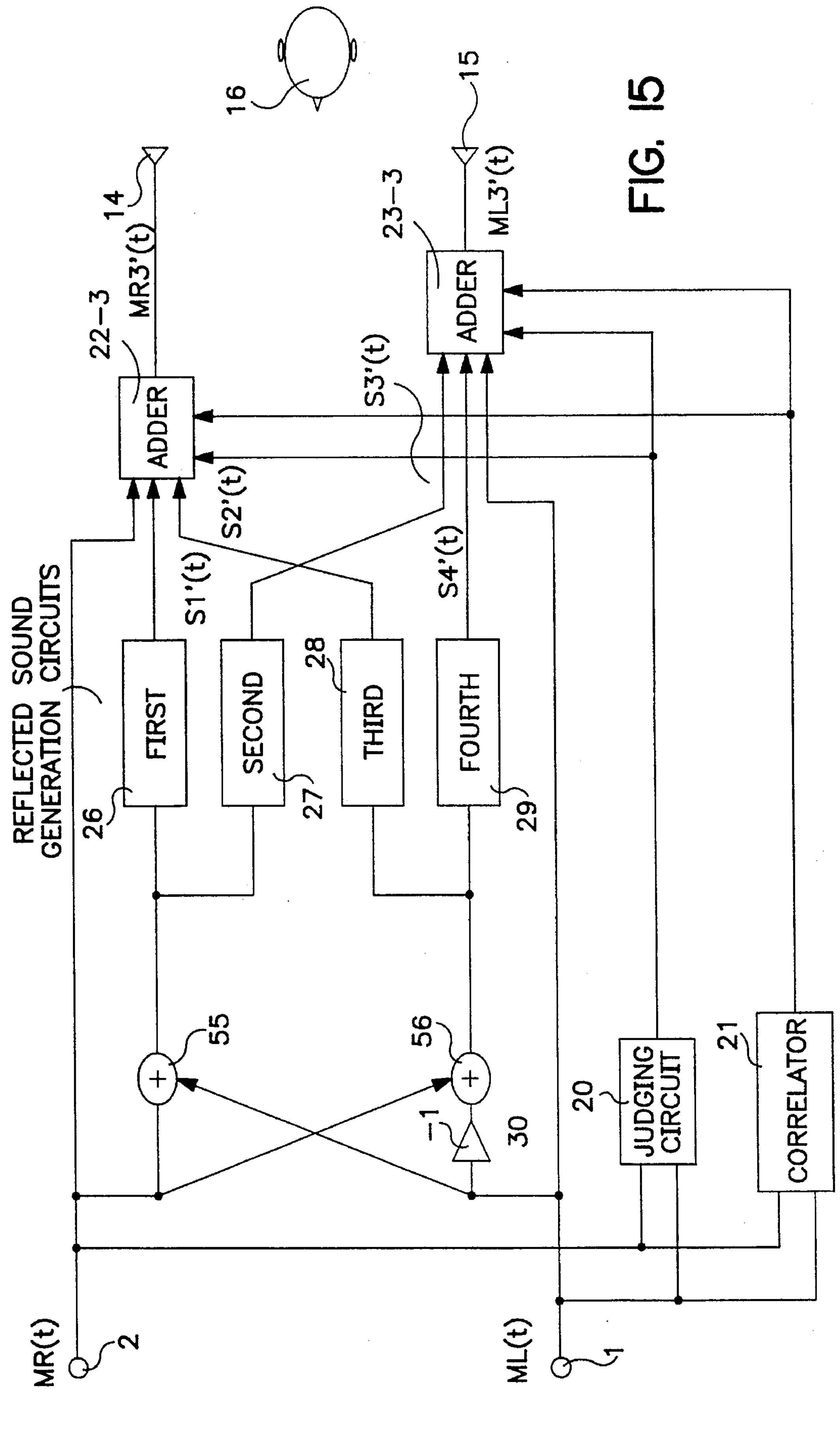
FIG. 15 is a hardware block diagram showing a sound field controller according to a tenth embodiment of the invention.

A sound field controller according to the tenth example of the invention will be explained with reference to FIG. 15. FIG. 15 shows a block diagram of the structure of a sound field controller according to the tenth example. The circuits having the same functions as the corresponding parts of the sound field controller in the previous examples are represented by the same reference numerals and will not be described in detail.

The adder 22-3 weighs and adds the input signal MR(t) from the input terminal 2, the signal S1'(t) from the operational circuit 26, and the signal S2'(t) from the operation circuit 28 with respective ratios based on the calculated result obtained from the signal judging circuit 20 and the correlator 21. The adder 23-3 weighs and adds the input signal ML(t) from the input terminal 1 and the signal S3'(t) from the operation circuit 27, and the signal S4'(t) from the operation circuit 29 with a respective ratio based on the calculated result obtained from the signal judging circuit 20 and the correlator 21. The output signals MR3'(t) and ML3'(t) from the adders 22-3 and 23-3 are reproduced from the speakers 14 and 15 respectively.

The adders 22-3 and 23-3 perform the addition in the same manner as the third example as follows:

$$MR3'(t)=MR(t)\cdot(1-\alpha\cdot A)+(S1'(t)+S2'(t))\cdot\alpha\cdot A \qquad (35)$$

$$ML3'(t)=ML(t)\cdot(1-\alpha\cdot A)+(S3'(t)+S4'(t))\cdot\alpha\cdot A \qquad (36)$$

EXAMPLE 11

Figure 16:
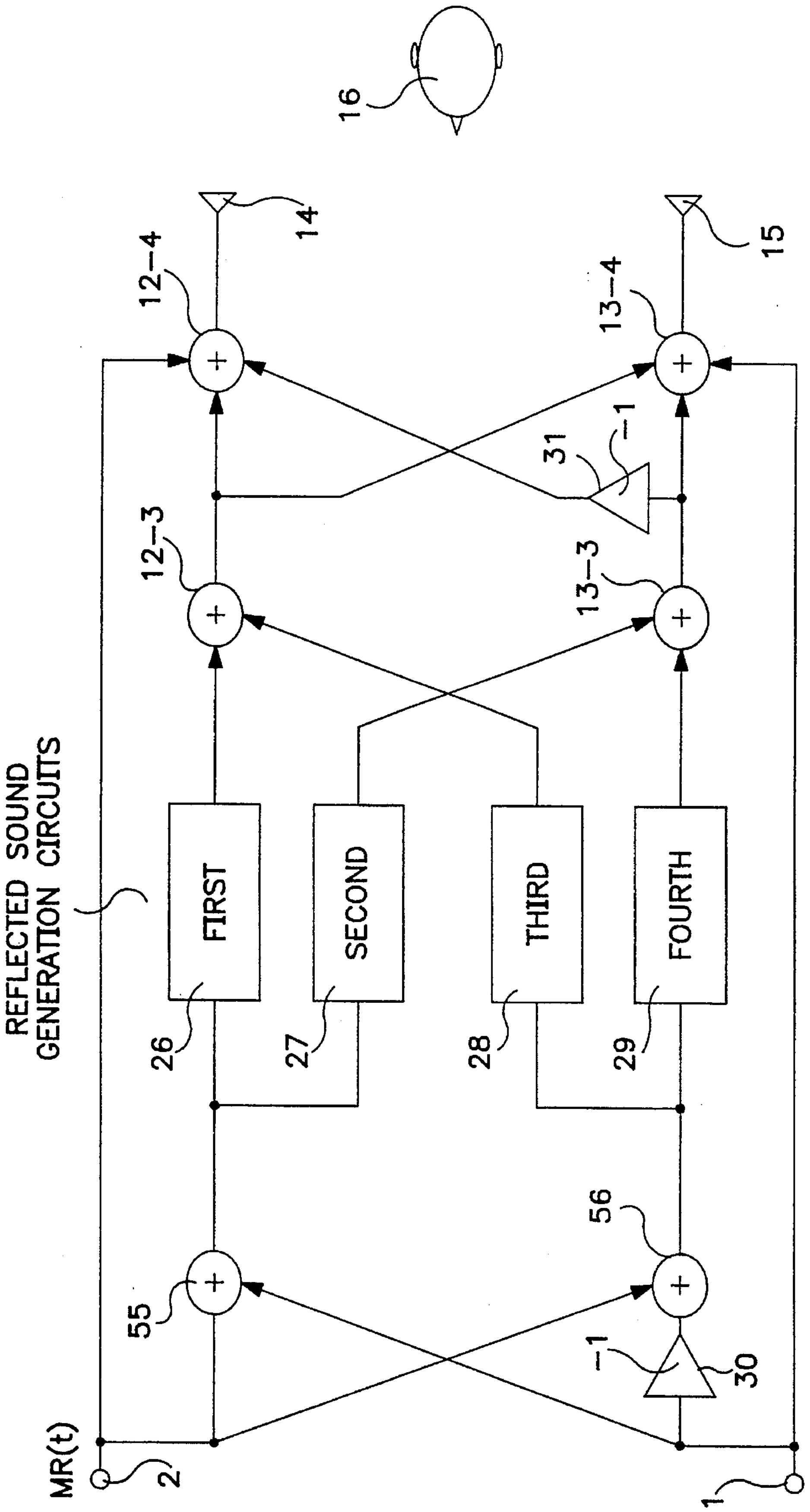
FIG. 16 is a hardware block diagram showing a sound field controller according to an 11th embodiment of the invention.

A sound field controller according to the eleventh example of the invention will be explained with reference to FIG. 16. FIG. 16 shows a block diagram of the structure of a sound field controller according to the eleventh example. The circuits having the same functions as the corresponding parts of the sound field controller in the previous examples are represented by the same reference numerals and will not be described in detail.

As is shown in FIG. 16, the sound field controller according to the eleventh example compared with that of the ninth example, instead of the adders 12-2 and 13-2, comprises an adder 12-3 for adding the signals from the reflected sound generation circuits 26 and 28, and an adder 13-3 for adding the signals of the reflected sound generation circuits 27 and 29. The sound field controller according to the eleventh example further comprises a multiplier circuit 31 for multiplying the input signal by −1, an adder 13-4 for adding the signals from the adder 12-3 and the multiplier circuit 31 to the input signal ML(t), and an adder 12-4 for adding the output signals from the adder 12-3 and the multiplier 31 to the input signal MR(t). In other words, the adder 12-4 produces a difference signal of the output signals from the adders 12-3 and 13-3, and the adder 13-4 produces a sum signal of output signals from the adders 12-3 and 13-3. The output signals from the adders 12-4 and 13-4 are reproduced by the speakers 14 and 15 respectively.

The operation of the sound field controller according to the eleventh example will be described as to the different portions from the previous examples.

The adder 56 adds MR(t) and −ML(t), outputting the resulting signal MR(t)−ML(t). In other words, the multiplier 30 and the adder 56 constitute a difference signal extraction means. The output from the adder 56 is divided into two portions which are applied to the reflected sound generation circuits 28 and 29 respectively. The reflection is added to MR(t)−ML(t) and the resulting signal is applied to the adders 12-3 and 13-3.

Similarly, the adder 55 adds the signal MR(t) and ML(t) to generate a sum signal MR(t)+ML(t). That is, the adder 55 functions as a sum signal generation means. The output from the adder 55 is divided into two portions, each applied to the reflected sound generation circuits 26 and 27. The reflection is added to MR(t)+ML(t) and the resulting signal is applied to the adders 12-3 and 13-3 respectively.

The reflected sound generation circuits 26, 27, 28, and 29 have a similar function as the reflected sound generation circuits 24 and 25 described in the fifth example. The output signals from the reflected sound generation circuits 26 and 28 are applied to the adder 12-3, and the output signals from the reflected sound generation circuits 27 and 29 are applied to the adder 13-3.

The adder 12-3 adds the outputs of the reflected sound generation circuits 26 and 28, with the resulting signal being divided into two portions. One of the signals is applied to the multiplier 31 and the other to the adder 13-4. The adder 13-3 adds the outputs of the reflected sound generation circuits 27 and 29, with the resulting signal being divided into two portions. One of the signals is applied to the multiplier 31 and the other to the adder 13-4. The adder 12-4 multiplies the output signal from the adder 13-3 by −1 and applies the resulting signal to the adder 12-4 and the adder 13-4. The adder 12-4 adds the input signal MR(t), the output of the adder 12-3 and the output from the multiplier 31, and applies the resulting sum signal to the speaker 14. In similar manner, the adder 13-4 adds the input signal ML(t), the output of the adder 12-3, and the output of the adder 13-3, and applies the resulting signal to the speaker 15.

In this way, the output signals from the reflected sound generation circuits 26 and 28, which are produced by the speaker 14, are in the same phase (i.e. inphase) with each other. On the other hand, the output signals from the reflected sound generation circuits 27 and 29, which are produced by the speaker 15 are in antiphase each other.

As explained above, the difference signal and the sum signal of the input stereo signals MR(t) and ML(t) are divided into two portions respectively. One portion of the difference signal and one portion the sum signal are reproduced in the same-phase, and the other portion of the difference signal and the other portion of the sum signal are reproduced in antiphases each other. Consequently, the feeling of expansion is obtained by antiphase reproduction, and at the same time, any uncomfortable antiphase feeling is attenuated by adding the same-phased signals to the antiphased signals to be reproduced.

EXAMPLE 12

Figure 17:
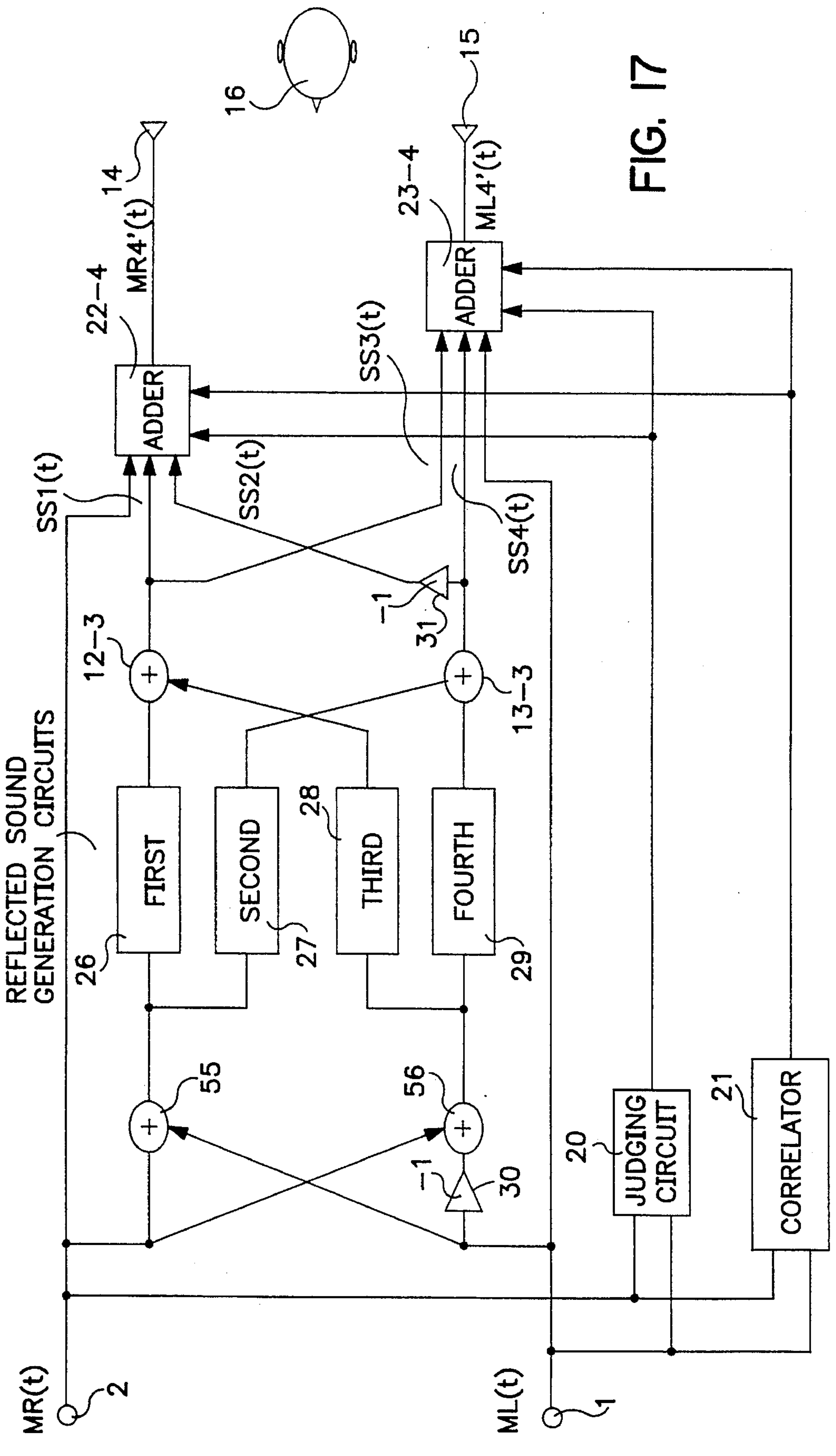
FIG. 17 is a hardware block diagram showing a sound field controller according to a 12th embodiment of the invention.

A sound field controller according to the twelfth example of the invention will be explained with reference to the FIG. 17. FIG. 17 shows a block diagram of the structure of a sound field controller according to the twelfth example. The circuits having the same functions as the corresponding parts of the sound field controller in the previous examples are represented by the same reference numerals and will not be described in detail.

As is shown in FIG. 17, the sound field controller according to the twelfth example, compared with that of the eleventh example, further comprises a signal judging circuit 20 and a correlator 21, and comprises an adder 22-4 for weighting and adding the signals with respective ratios based on the calculated result obtained from the signal judging circuit 20 and the correlator 21 instead of the adder 12-4, and an adder 23-4 instead of the adder 13-4.

The operation of the sound field controller according to the twelfth example will be described as to the different portions from the previous examples.

The adder 22-4 is supplied with the signal SS1(t) output from the adder 12-3, the signal SS2(t) output from the multiplier 31, and the input signal MR(t) from the input terminal 2. The adder 23-4, on the other hand, is supplied with the signal SS3(t) output from the adder 12-3, the signal SS4(t) output from the adder 13-3, and the input signal ML(t) applied to the input terminal 1. The adders 22-4 and 23-4 perform summation according to the equations as shown below in a manner similar to the third example.

$$MR4'(t)=MR(t)\cdot(1-\alpha\cdot A)+(SS1(t)+SS2(t))\cdot\alpha\cdot A \quad (37)$$

$$ML4'(t)=ML(t)\cdot(1-\alpha\cdot A)+(SS3(t)+SS4(t))\cdot\alpha\cdot A \quad (38)$$

The output signals MR4'(t) and ML4'(t) from the adders 22-4 and 23-4 are thus produced by the speakers 14 and 15.

EXAMPLE 15

Figure 18:
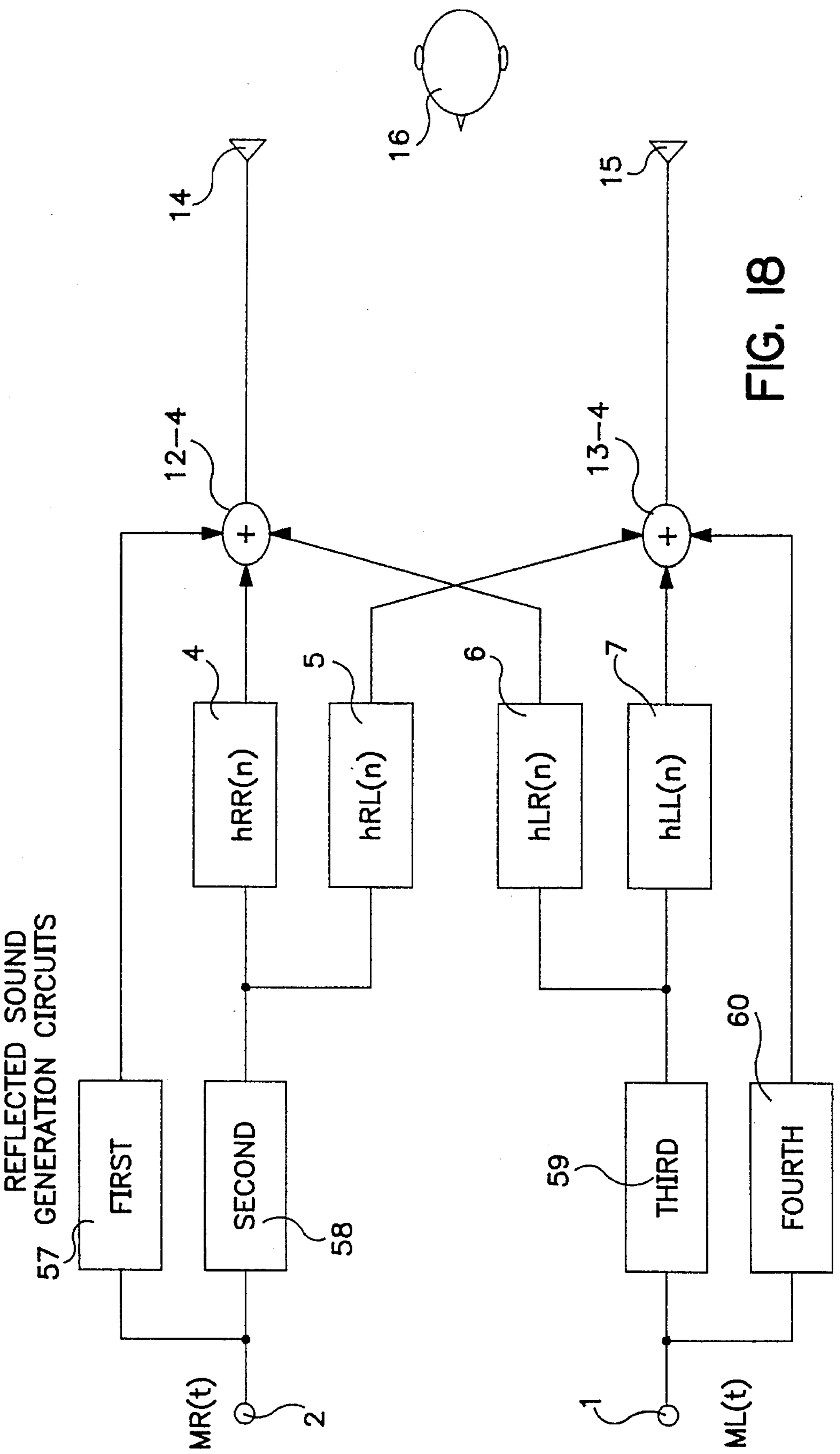
FIG. 18 is a hardware block diagram showing a sound field controller according to a 13th embodiment of the invention.

A sound field controller according to the thirteenth example of the invention will be explained with reference to the figures. FIG. 18 shows a block diagram of the structure of a sound field controller according to the thirteenth example. The circuits having the same functions as the corresponding parts of the sound field controller in the previous examples are represented by the same reference numerals and will not be described in detail.

The signal ML(t) to be reproduced from an Lch and the signal MR(t) to be reproduced from an Rch as viewed from the listener 16 are applied to the input terminals 1 and 2 respectively. Each of these signals is divided into two branches. The branched signals of ML(t) are applied to the reflected sound generation circuits 57 and 58, and those of MR(t) to the reflected sound generation circuits 59 and 60. The reflected sound generation circuits 57, 58, 59, and 60 generate a reflection and a reverberation by simulating the sound field in a music hall, etc.

The output signal from the reflected sound generation circuits 57 and 60 are applied to the adders 12-4 and 13-4 respectively. The output signal from the reflected sound generation circuit 58 is further divided into two branch signals and applied to the operational circuits 4 and 5, and the output signal from the reflected sound generation circuit 59 is divided into two branch signals and applied to the operational circuits 6 and 7. These operational circuits digitally process the head related transfer function in a time domain in such a manner as to localize the sound on the left and right sides or left and right rear of the listener 16.

The output signals of the operational circuits 4 and 6 are applied to the adder 12-4 and the output signals of the operational circuits 5 and 7 are applied to the adder 13-4. The adders 12-4 and 13-4 are also supplied with the output signals from the reflected sound generation circuits 57 and 60, and output sum signals to the speakers 14 and 15 respectively.

The operation of the sound field controller according to this example will be explained with reference to FIGS. 18, and 19A to 19C.

The 2ch signals ML(t) and MR(t) are applied to the input terminals 1 and 2, and then to the reflected sound generation circuits 57 and 58, and 59 and 60, respectively. The reflection and/or reverberation is generated by the reflected sound generation circuits 57 and 58 functioning as a pair, and by the reflected sound generation circuits 59 and 60 as another pair.

FIGS. 19A and 19B show a reflection series generated by the reflected sound generation circuits 57 and 58 schematically. In FIGS. 19A and 19B, the horizontal axis of the coordinate represents the time, and the vertical axis of the coordinate represents the amplitude. For example, when the output signal from the reflected sound generation circuit 58 is localized on the right side or right rear other than the position of the speaker 14 or 15 by using the operational circuits 4 and 5, the delay time and the amplitude of the reflection in the reflected sound generation circuits 57 and 58 are set up as shown in FIGS. 19A and 19B respectively.

Assuming that the output signal of the reflected sound generation circuit 58 can be processed and played electrically (or virtually) at the position of the speaker 61 as shown in FIG. 19C, and when the delay time and amplitudes of the reflection generated by the reflected sound generation circuits 57 and 58 are set up as shown in FIGS. 19A and 19B, the output signal of the reflected sound generation circuit 58 is perceived to be produced from the speaker 61 and the output signal of the reflected sound generation circuit 57 is produced from the speaker 14. The components of the reflection are indicated by the letters A to E in the FIGS. 19A to 19C.

In this reproduction process, a sound image is perceived to be synthesized by the human aural characteristics, and recognized as if the reflection is coming from the positions between the speakers 14 and 61 shown in FIG. 19C (See "Spatial Acoustics" by Jens Blauert et al., Kajima Publishing Co., Ltd.). In FIG. 19C, the reflection is indicated by vectors with each length corresponding to the magnitude of the sound (component). Also, the reflections shown in FIGS. 19A and 19B have a time delay. In order to synthesize the reflection between the speakers 14 and 61, the time difference between the reflections from the two speakers may be used as well as the amplitude difference.

These reflections to be produced can be obtained by measurement in an actual hall or by simulation utilizing the sound ray method or the like. The reflected sound generation circuits 57, 58, 59, and 60 for generating these reflections have the same structure as the corresponding circuits in the seventh example. Similarly, in the reflected sound generation circuits 59 and 60, the delay time and the amplitude of reflections are set up such that the reflection is synthesized leftward.

The output signal from the reflected sound generation circuit 58 is divided into two branch signals and applied to the operational circuits 4 and 5 for localizing the sound on the right side or right rear of the listener 16. Similarly, the output signal from the reflected sound generation circuit 59 is divided into two branch signals and applied to the operational circuits 6 and 7 for localizing the sound on the left side or left rear of the listener 16. These operational circuits perform a convolution and apply the resulting signals to the corresponding adders respectively. The sum signals from the adders are reproduced by the speakers 14 and 15, whereby providing (i.e. localizing) a phantom speaker on the left and/or right sides of the listener 16 at the same time. As described above, therefore, the reflections are synthesized and produced between the phantom speaker(s) and the speakers 14 and 15.

As described above, according to the present invention, a sound field controller is provided in which a reflection and/or a reverberation is generated by adjusting the delay time and the amplitude of reflected sound generation circuits. Further, a sound to be reproduced including the reflection can be perceived to be come from a place other than the reproduction point of the speaker. It is thus possible to reproduce a sound with presence without using any additional speakers on the sides or rear of the listener.

According the present invention, a sound field controller is provided in which the summation ratio of the surround signal (such as the reverberation and the reflection) and the input stereo signals are appropriately adjusted so as to reproduce a sound with presence retaining a desirable clear sound. In other words, the surround signal is effectively reproduced without making the main signal unclear.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A sound field controller for reproducing a sound field with presence comprising;

input means for inputting an input audio signal having a first and a second channel signal, signal extracting means for receiving and processing the input audio signal, and producing an extracted signal from the input audio signal, first delay means, directly connected to the signal extracting means, for delaying the extracted signal by a first predetermined time, and producing a first delayed signal, second delay means, directly connected to the signal extracting means, for delaying the extracted signal by a second predetermined time which is different from the first predetermined time, and producing a second delayed signal, signal judging means for receiving the input audio signal and judging whether the input audio signal is a voice signal or a non-voice audio signal to output a detecting signal indicating the result, correlation determining means for determining correlation ratio between the two channel signals of the input audio signal to output a determining signal, first adding means for receiving the first channel signal, the first delayed signal, the detecting signal, and the determining signal, adding the first channel signal and the first delayed signal with a predetermined summation ratio based on the detecting signal and the determining signal, and producing a resulting first summed signal, second adding means for receiving the second channel signal, the second delayed signal, the detecting signal, and the determining signal, adding the second channel signal and the second delayed signal with a predetermined summation ratio based on the detecting signal and the determining signal, and producing a resulting second summed signal, first output means for reproducing the first summed signal, and second output means for reproducing the second summed signal.

2. A sound field controller for reproducing a sound field with presence comprising;

input means for inputting an audio sound signal having a first and a second channel signals, signal extracting means for receiving and processing the audio signal, and producing a sum signal and a difference signal of the first and the second channel signals, first signal processing means for receiving and processing the sum signal, and for producing a first and a second reflected sound signal which simulate a specified sound field, second signal processing means for receiving and processing the difference signal, and for producing a third and a fourth reflected sound signal which simulate the specified sound field, first adding means for receiving the first channel signal, the first and third reflected sound signals, and adding the first channel signal, the first and the third reflected sound signals with a predetermined summation ratio to produce a first summed signal, second adding means for receiving the second channel signal, the second and fourth reflected sound signals, and adding the second channel signal, the second and the fourth reflected sound signals with a predetermined summation ratio to produce a second summed signal, first output means for reproducing the first summed signal, and second output means for reproducing the second summed signal.

3. A sound field controller according to claim 2, further comprising;

signal judging means for receiving the input audio signal and judging whether the input audio signal is a voice signal or a non-voice audio signal to output a detecting signal indicating the result, correlation determining means for determining correlation ratio between the first and the second channel signals of the input audio signal to output a determining signal, wherein each of the first and second adding means further receives the detecting signal and the determining signal, and adjusts the summation ratio based on the detecting signal and the determining signal.

4. A sound field controller according to claim 2, wherein, the first adding means includes third adding means for receiving the first and third reflected sound signals, and for adding the first and the third reflected sound signals with a predetermined summation ratio to produce a first output signal, and the second adding means includes fourth adding means for receiving the second and the fourth reflected sound signals, and for adding the second and the fourth reflected sound signals with a predetermined summation ratio to produce a second output signal, and wherein the first adding means further includes first signal mixing means for receiving the first channel signal, the first and the second output signals, and for subtracting the second output signal from the first channel signal and the first output signal with a predetermined subtracting ratio to produce the first summed signal, and the second adding means further includes second signal mixing means for receiving the second channel signal, and first and the second output signals, and for adding the second channel, the first output signal and the second output signal with a predetermined summation ratio to produce the second summed signal.

5. A sound field controller according to claim 4, further comprising;

signal judging means for receiving the input audio signal and judging whether the input audio signal is a voice signal or a non-voice audio signal to output a detecting signal indicating the result, correlation determining means for determining correlation ratio between the first and the second channel signals of the input audio signal to output a determining signal, wherein the first signal mixing means further receives the detecting signal and the determining signal, and adjusts the subtracting ratio based on the detecting signal and the determining signal, and the second signal mixing means further receives the detecting signal and the determining signal, and adjusts the summation ratio based on the detecting signal and the determining signal.

6. A sound field controller according to claim 2, wherein each of the first and the fourth reflected sound signals includes a reverberated sound signal.

* * * * *

UNITED STATES PATENT AND TRADE MARK OFFICE

CERTIFICATE OF CORRECTION

PATENT NO. : 5,572,591
DATED : November 5, 1996
INVENTOR(S) : Numazu et al.

It is certified that error appears in the above-identified patent and that said Letters Patent is hereby corrected as shown below:

On the cover page, item [56] References Cited, U.S. PATENT DOCUMENTS, cite the following:

| | | |
|---|---|---|
| 4,706,291 | 11/1987 | Kakubo et al. |

Under FOREIGN DOCUMENTS cite:

| | | |
|---|---|---|
| 0422955 | 4/1991 | EPO |
| 1-182952 | 7/1989 | Japan |
| 1-144900 | 6/1989 | Japan |

Under OTHER PUBLICATIONS cite:

European Search report dated 6/23/94 corresponding to European Patent Application No. 94103584.2.

Signed and Sealed this

Seventh Day of April, 1998

Attest:

BRUCE LEHMAN

*Attesting Officer* *Commissioner of Patents and Trademarks*